US012694944B2

(12) United States Patent
Yamada

(10) Patent No.: US 12,694,944 B2
(45) Date of Patent: Jul. 28, 2026

(54) SEMICONDUCTOR MEMORY DEVICE AND MEMORY SYSTEM

(71) Applicant: Kioxia Corporation, Tokyo (JP)

(72) Inventor: Junji Yamada, Yokohama Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 78 days.

(21) Appl. No.: 18/589,628

(22) Filed: Feb. 28, 2024

(65) Prior Publication Data

US 2024/0321382 A1 Sep. 26, 2024

(30) Foreign Application Priority Data

Mar. 23, 2023 (JP) ................................. 2023-046836

(51) Int. Cl.
*G11C 29/52* (2006.01)
*G11C 7/10* (2006.01)

(52) U.S. Cl.
CPC ............ *G11C 29/52* (2013.01); *G11C 7/1069* (2013.01); *G11C 7/1096* (2013.01)

(58) Field of Classification Search
CPC ..... G11C 29/52; G11C 7/1069; G11C 7/1096; G11C 7/1006; G11C 11/5628; G11C 11/5642; G11C 16/0483; G11C 16/10; G11C 2029/0411; G11C 16/26; G06F 11/10; G06F 11/1048
USPC .................................................. 365/185.09
See application file for complete search history.

(56) References Cited

U.S. PATENT DOCUMENTS

2018/0039541 A1* 2/2018 Hahn ...................... G06F 3/065

FOREIGN PATENT DOCUMENTS

| CN | 110914807 A | * | 3/2020 | ............ H03M 13/63 |
| JP | 2012-212233 A | | 11/2012 | |
| JP | 2019169127 A | * | 10/2019 | ............ G11C 29/42 |

OTHER PUBLICATIONS

"High Bandwidth Memory (HBM) DRAM", JESD235, JEDEC Solid State Technology Association, Oct. 2013.
"High Bandwidth Memory DRAM (HBM1, HBM2)", JESD235D, Jedec Solid State Technology Association, Feb. 2021.
"High Bandwidth Memory DRAM (HBM3)", JESD238A, Jedec Sold State Technology Association, Jan. 2023 (limited preview version as available).
"High Bandwidth Memory DRAM (HBM3)", JESD238, Jedec Solid State Technology Association, Jan. 2022.
"High Bandwidth Memory DRAM (HBM3)", JESD238A, Jedec Sold State Technology Association, Jan. 2023 (full version).

* cited by examiner

*Primary Examiner* — Fernando Hidalgo
(74) *Attorney, Agent, or Firm* — Foley & Lardner LLP

(57) ABSTRACT

A semiconductor memory device includes a memory cell array configured to store data, and a control circuit configured to control a write operation of writing data into the memory cell array. In the write operation, the control circuit is configured to receive first data and second data including a parity bit, generate a parity bit for the first data, check whether the parity bit and the parity bit match with each other, and write the first data into the memory cell array.

39 Claims, 23 Drawing Sheets

*FIG. 2*

TRANSMISSION DATA

WRITE DATA AND READ DATA

FIG. 13

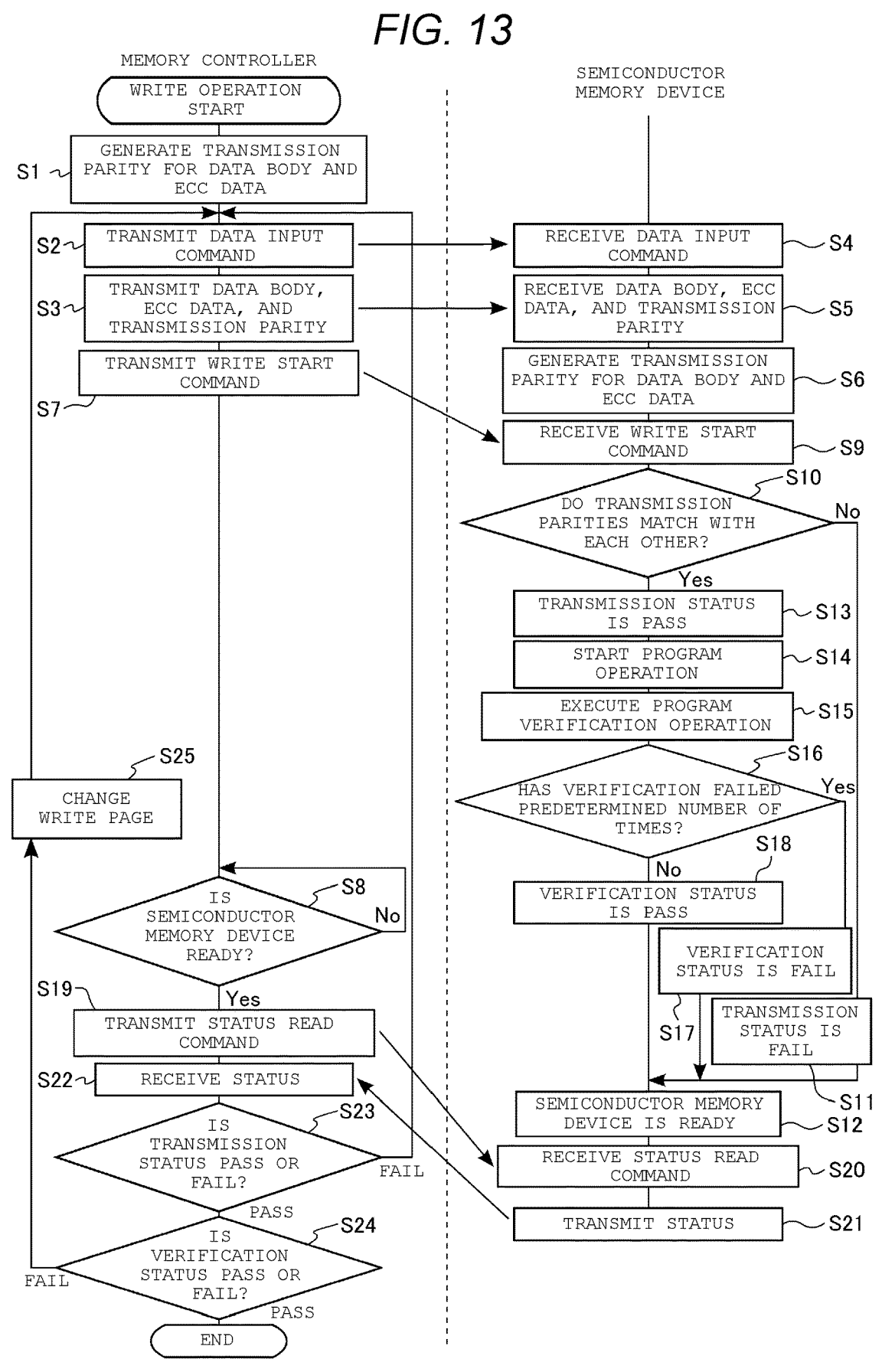

MEMORY CONTROLLER

SEMICONDUCTOR
MEMORY DEVICE

WRITE OPERATION
START

S1 — GENERATE TRANSMISSION PARITY FOR DATA BODY AND ECC DATA

S2 — TRANSMIT DATA INPUT COMMAND → RECEIVE DATA INPUT COMMAND — S4

S3 — TRANSMIT DATA BODY, ECC DATA, AND TRANSMISSION PARITY → RECEIVE DATA BODY, ECC DATA, AND TRANSMISSION PARITY — S5

S7 — TRANSMIT WRITE START COMMAND

GENERATE TRANSMISSION PARITY FOR DATA BODY AND ECC DATA — S6

RECEIVE WRITE START COMMAND — S9

S10 — DO TRANSMISSION PARITIES MATCH WITH EACH OTHER?   No

Yes

TRANSMISSION STATUS IS PASS — S13

START PROGRAM OPERATION — S14

EXECUTE PROGRAM VERIFICATION OPERATION — S15

S16 — HAS VERIFICATION FAILED PREDETERMINED NUMBER OF TIMES?   Yes

No   S18

VERIFICATION STATUS IS PASS

VERIFICATION STATUS IS FAIL

S25 — CHANGE WRITE PAGE

S8 — IS SEMICONDUCTOR MEMORY DEVICE READY?   No

S17   TRANSMISSION STATUS IS FAIL

S11

SEMICONDUCTOR MEMORY DEVICE IS READY — S12

S19 — TRANSMIT STATUS READ COMMAND

Yes

RECEIVE STATUS READ COMMAND — S20

S22 — RECEIVE STATUS

S23 — IS TRANSMISSION STATUS PASS OR FAIL?   FAIL

TRANSMIT STATUS — S21

PASS

S24 — IS VERIFICATION STATUS PASS OR FAIL?

FAIL

PASS

END

MEMORY CONTROLLER ( WRITE OPERATION START )

Figure 22:
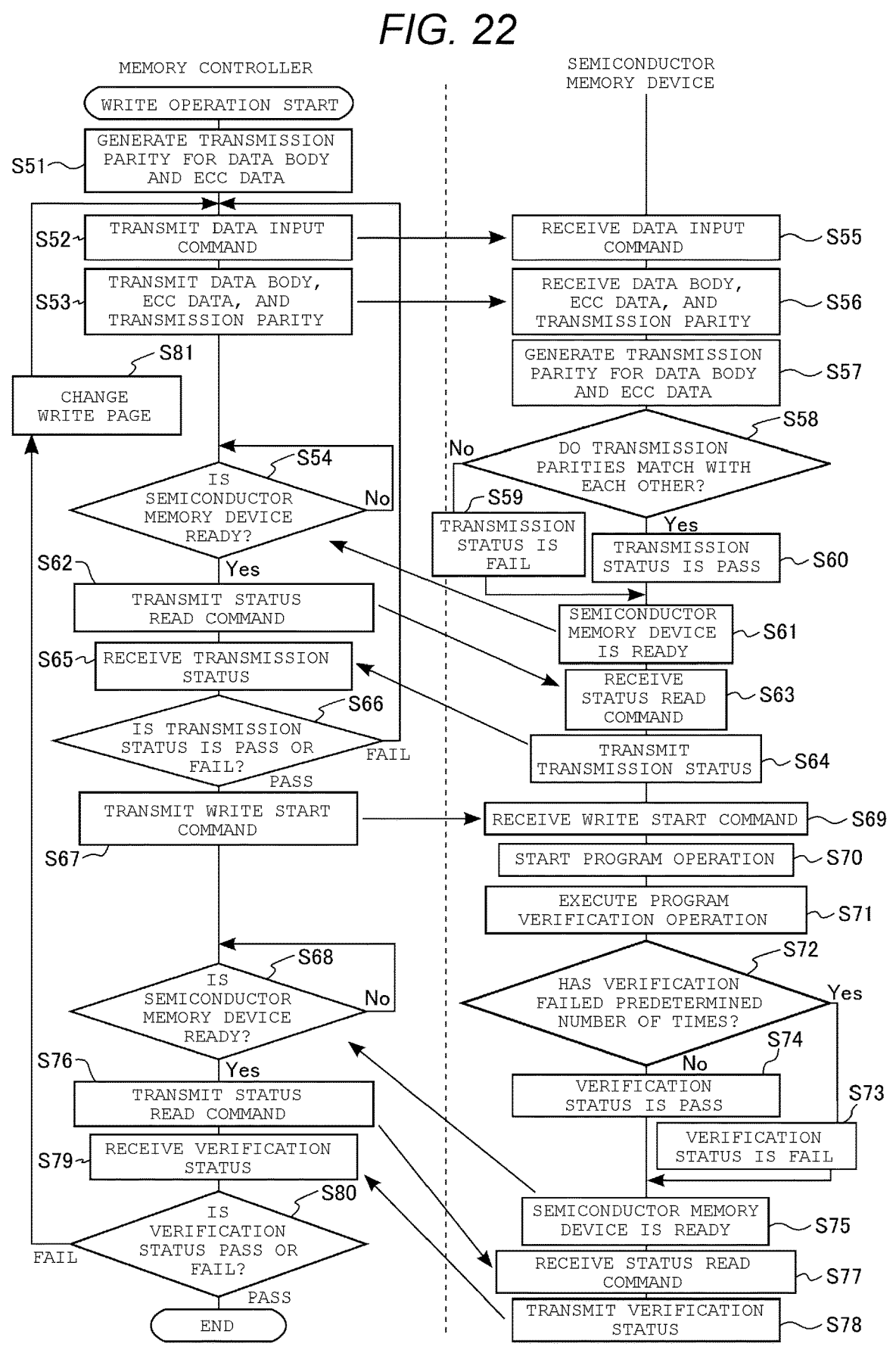

S51 — GENERATE TRANSMISSION PARITY FOR DATA BODY AND ECC DATA

S52 — TRANSMIT DATA INPUT COMMAND

S53 — TRANSMIT DATA BODY, ECC DATA, AND TRANSMISSION PARITY

S81 — CHANGE WRITE PAGE

S54 — IS SEMICONDUCTOR MEMORY DEVICE READY? → No

Yes

S62 — TRANSMIT STATUS READ COMMAND

S65 — RECEIVE TRANSMISSION STATUS

S66 — IS TRANSMISSION STATUS IS PASS OR FAIL? → FAIL

PASS

S67 — TRANSMIT WRITE START COMMAND

S68 — IS SEMICONDUCTOR MEMORY DEVICE READY? → No

Yes

S76 — TRANSMIT STATUS READ COMMAND

S79 — RECEIVE VERIFICATION STATUS

S80 — IS VERIFICATION STATUS PASS OR FAIL? → FAIL

PASS ( END )

SEMICONDUCTOR MEMORY DEVICE

S55 — RECEIVE DATA INPUT COMMAND

S56 — RECEIVE DATA BODY, ECC DATA, AND TRANSMISSION PARITY

S57 — GENERATE TRANSMISSION PARITY FOR DATA BODY AND ECC DATA

S58 — DO TRANSMISSION PARITIES MATCH WITH EACH OTHER? → No

S59 — TRANSMISSION STATUS IS FAIL

Yes

S60 — TRANSMISSION STATUS IS PASS

S61 — SEMICONDUCTOR MEMORY DEVICE IS READY

S63 — RECEIVE STATUS READ COMMAND

S64 — TRANSMIT TRANSMISSION STATUS

S69 — RECEIVE WRITE START COMMAND

S70 — START PROGRAM OPERATION

S71 — EXECUTE PROGRAM VERIFICATION OPERATION

S72 — HAS VERIFICATION FAILED PREDETERMINED NUMBER OF TIMES? → Yes

No — S74

S73 — VERIFICATION STATUS IS PASS

VERIFICATION STATUS IS FAIL

S75 — SEMICONDUCTOR MEMORY DEVICE IS READY

S77 — RECEIVE STATUS READ COMMAND

S78 — TRANSMIT VERIFICATION STATUS

FIG. 24

SEMICONDUCTOR MEMORY DEVICE AND MEMORY SYSTEM

CROSS-REFERENCE TO RELATED APPLICATION

This application is based upon and claims the benefit of priority from Japanese Patent Application No. 2023-046836, filed Mar. 23, 2023, the entire contents of which are incorporated herein by reference.

FIELD

Embodiments described herein relate generally to a semiconductor memory device and a memory system.

BACKGROUND

As a semiconductor memory device, for example, a NAND flash memory where memory cells are two-dimensionally or three-dimensionally located is known. The NAND flash memory and a memory controller that controls the NAND flash memory configure a memory system.

DESCRIPTION OF THE DRAWINGS

FIG. 2 is a block diagram illustrating a configuration of a semiconductor memory device according to the first embodiment;

FIG. 13 is a flowchart illustrating a write operation in the memory system according to the first embodiment;

FIG. 14 is a timing chart illustrating the write operation in the memory system according to the first embodiment;

FIG. 19 is a timing chart illustrating the read operation in the memory system according to the first embodiment;

FIG. 22 is a flowchart illustrating a write operation in a memory system according to a second embodiment;

FIG. 24 is a timing chart illustrating the write operation in the memory system according to the second embodiment.

DETAILED DESCRIPTION

Figure 1:
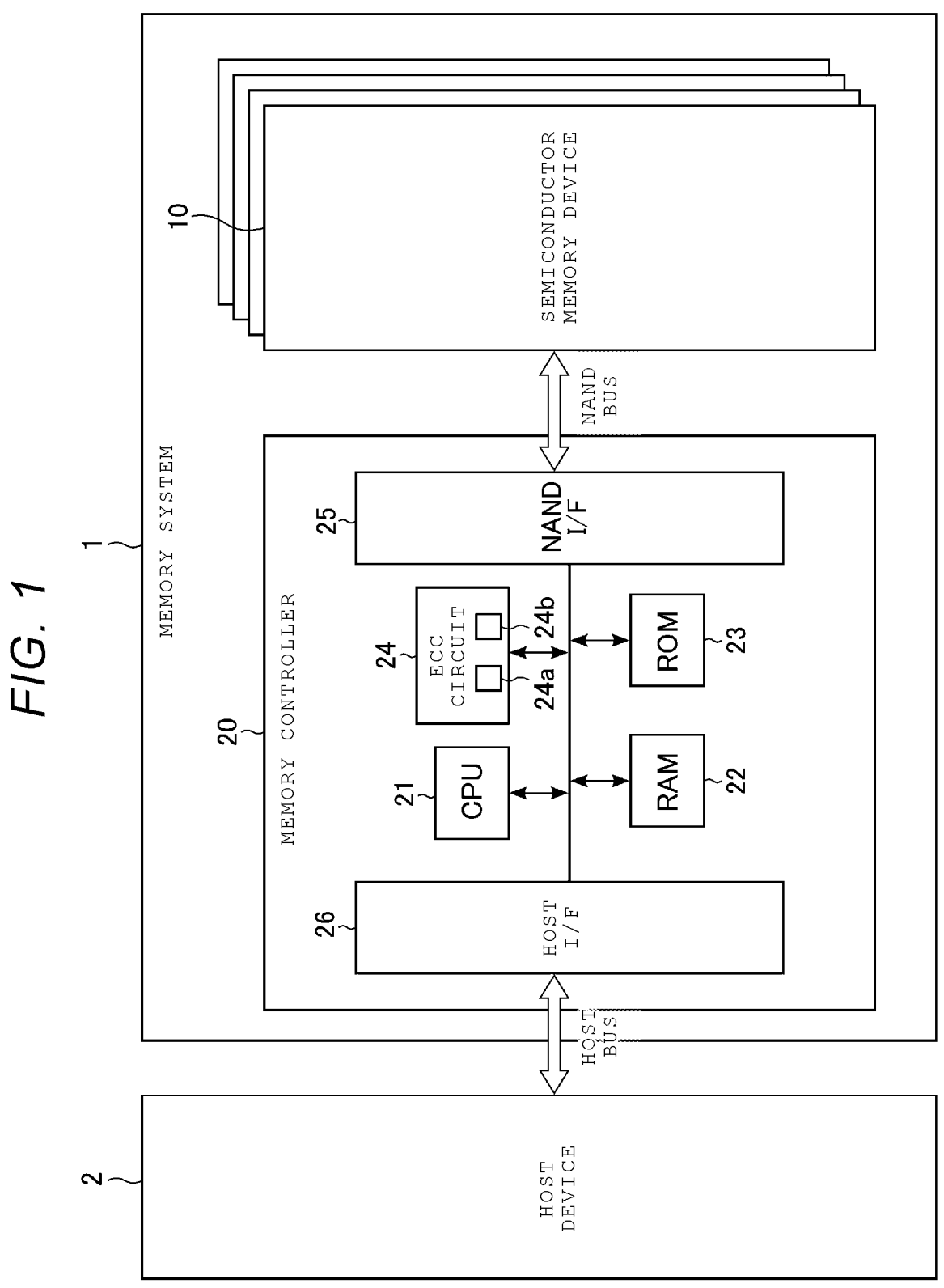
FIG. 1 is a block diagram illustrating a configuration of a memory system according to a first embodiment.

At least one embodiment provides a semiconductor memory device and a memory system capable of reducing a period of time of a write operation and a read operation.

In general, according to at least one embodiment, a semiconductor memory device includes: a memory cell array configured to store data; and a control circuit configured to control a write operation of writing data into the memory cell array. In the write operation, the control circuit is configured to receive first data and second data including a first parity bit, generate a second parity bit for the first data, check whether the first parity bit and the second parity bit match with each other, and write the first data into the memory cell array.

In the following description, components having the same functions and configurations are represented by the same reference numerals. The embodiments described below show an example of a device or a method for practicing the technical ideas of at least one embodiment, and materials, shapes, structures, arrangement, and the like of components are not limited to those described below.

Functional blocks can be realized by hardware, computer software, or a combination of hardware and computer software. The functional blocks are not necessarily divided as described in the following examples. For example, some functions may be executed by a functional block different from an example functional block. The example functional block may be further divided into small functional sub-blocks.

Hereinafter, a memory system including a semiconductor memory device and a memory controller according to at least one embodiment will be described. Hereinafter, as an example of the semiconductor memory device, a three-dimensionally stacked NAND flash memory where memory cell transistors are three-dimensionally stacked above a semiconductor substrate will be described.

A memory system according to a first embodiment will be described. In a write operation, data is transmitted from a memory controller to a semiconductor memory device, and the data is written into a memory cell array of the semiconductor memory device. In a read operation, data written in the memory cell array is read by the semiconductor memory device, and the read data is transmitted from the semiconductor memory device to the memory controller.

In the write operation and the read operation, when data is transmitted and received between the memory controller and the semiconductor memory device, error may occur in the data. The error occurring in the data during the transmission is called transmission error. During the write operation, a memory cell as a write target in the memory cell array may be defective such that the data cannot be written into the memory cell. When data is written into the memory cell array and subsequently is read from the memory cell array, error may occur in the data. The error occurring in the data during the write and read operation is called memory error.

In the first embodiment and a second embodiment, transmission error and memory error are distinguished from each other. Specifically, in the write operation and the read operation, an operation appropriate to a case where data includes transmission error or an operation appropriate to a case where data includes memory error is executed depending on whether data includes transmission error or memory error.

1. First Embodiment

The memory system according to the first embodiment will be described.

1.1 Configuration of Memory System

A configuration of the memory system according to the first embodiment will be described. FIG. 1 is a block diagram illustrating the configuration of the memory system according to the first embodiment. The memory system 1 is connected to an external host device 2 and can execute various operations according to commands from the host device 2. The memory system 1 includes a plurality of semiconductor memory devices 10 and a memory controller 20.

The semiconductor memory device 10 includes a NAND flash memory and stores data in a nonvolatile manner. The details of the semiconductor memory device 10 will be described below.

The memory controller 20 is connected to the plurality of semiconductor memory devices 10 via a NAND bus. The memory controller 20 controls the plurality of semiconductor memory devices 10. The NAND bus transmits and receives signals based on a NAND interface. The memory controller 20 is also connected to the host device 2 via a host bus. The memory controller 20 accesses the semiconductor memory device 10 in response to commands received from the host device 2.

For example, the semiconductor memory device 10 and the memory controller 20 may be combined to configure one semiconductor device, and examples of the semiconductor device include a memory card such as a SD™ card and a solid state drive (SSD). The memory controller 20 may be, for example, a system-on-a-chip (SoC).

The host device 2 is, for example, a digital camera or a personal computer, and the host bus is, for example, a bus based on a SD™ interface.

1.1.1 Memory Controller

A configuration of the memory controller 20 will be described using FIG. 1. The memory controller 20 includes a central processing unit (CPU) (or a processor) 21, a random access memory (RAM) 22, a read only memory (ROM) 23, an error checking and correcting (ECC) circuit 24, a NAND interface circuit (NAND I/F) 25, and a host interface circuit (host I/F) 26.

The CPU 21 controls an overall operation of the memory controller 20. For example, when a write command is received from the host device 2, the CPU 21 issues a write command to the NAND interface circuit 25 correspondingly. When a read command and an erase command are received, likewise, the CPU 21 issues a read command and an erase command, respectively, to the NAND interface circuit 25 correspondingly.

The CPU 21 executes various processes such as wear leveling for managing the semiconductor memory device 10. An operation of the memory controller 20 described below may be implemented by the CPU 21 executing software (or firmware) or may be implemented by hardware.

The RAM 22 is used as a work area of the CPU 21. The RAM 22 is, for example, a semiconductor memory such as a dynamic random access memory (DRAM) or a static random access memory (SRAM). The RAM 22 also temporarily stores firmware for managing the semiconductor memory device 10, various management tables, data, and the like.

The ROM 23 stores, for example, firmware that is executed by the CPU 21.

The ECC circuit 24 executes a process regarding detection and correction of error on data to be written into the semiconductor memory device 10 and data read from the semiconductor memory device 10. The ECC circuit 24 includes a first ECC circuit 24a and a second ECC circuit 24b. The first ECC circuit 24a and the second ECC circuit 24b will be described below in detail.

The NAND interface circuit 25 is connected to the semiconductor memory device 10 via the NAND bus and controls communication with the semiconductor memory device 10. The NAND interface circuit 25 transmits various signals, commands, and data to the semiconductor memory device 10 based on a command received from the CPU 21. The NAND interface circuit 25 also receives various signals and data from the semiconductor memory device 10.

The host interface circuit 26 is connected to the host device 2 via the host bus and controls communication with the host device 2. The host interface circuit 26 transmits commands and data received from the host device 2 to each of the CPU 21 and the RAM 22. The host interface circuit 26 transmits data in the RAM 22 to the host device 2 in response to commands from the CPU 21.

1.1.2 Semiconductor Memory Device

Next, a configuration of the plurality of semiconductor memory devices 10 will be described. The configurations of the semiconductor memory devices 10 are the same as each other.

Figure 2:
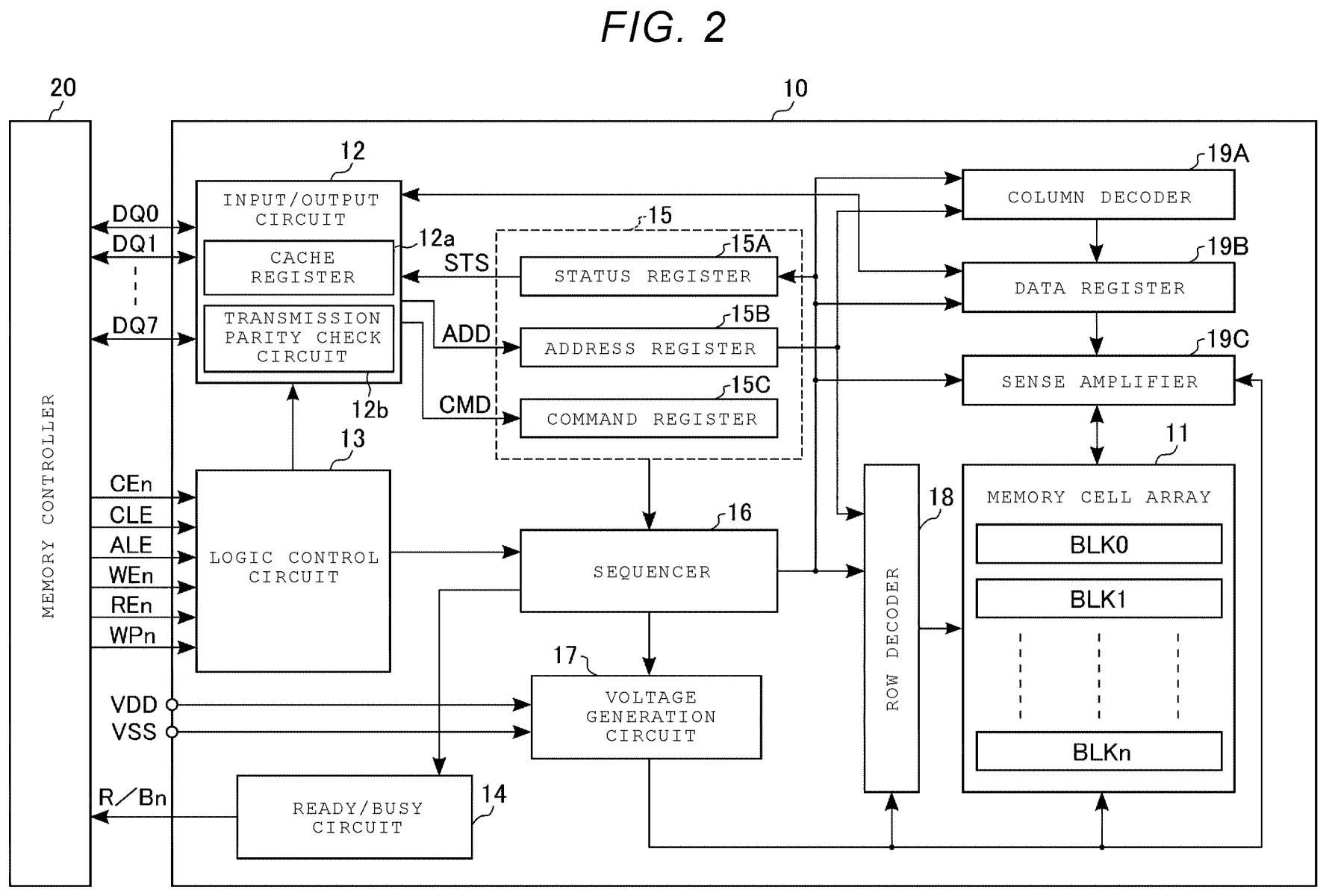

FIG. 2 is a block diagram illustrating the configuration of the semiconductor memory device 10 according to the first embodiment.

The semiconductor memory device 10 includes a memory cell array 11, an input/output circuit 12, a logic control circuit 13, a ready/busy circuit 14, a register group 15, a sequencer (or a control circuit) 16, a voltage generation circuit 17, a row decoder 18, a column decoder 19A, a data register 19B, and a sense amplifier 19C. The input/output circuit 12 includes a cache register 12a and a transmission parity check circuit 12b. The register group 15 includes a status register 15A, an address register 15B, and a command register 15C.

The memory cell array 11 includes one or a plurality of blocks BLK0, BLK1, BLK2, . . . , BLKn (n represents an integer of 0 or more). Each of the plurality of blocks BLK0 to BLKn includes a plurality of memory cell transistors (hereinafter, also referred to as "memory cells") associated with rows and columns. The memory cell transistor is an electrically erasable and programmable nonvolatile memory. The memory cell array 11 includes a plurality of word lines, a plurality of bit lines, and a source line for applying voltage to the memory cell transistors. A specific configuration of the block BLKn will be described below.

The input/output circuit 12 and the logic control circuit 13 are connected to the memory controller 20 via an input/output terminal (or a NAND bus). The input/output circuit 12 transmits and receives input and output signals (I/O signals) DQ (for example, DQ0, DQ1, DQ2, . . . , DQ7) to and from the memory controller 20 via the input/output terminal. The I/O signals DQ enable communication of a command, an address, data, and the like. The cache register 12a in the input/output circuit 12 temporarily stores data that is transmitted and received between the memory controller 20 and the semiconductor memory device 10. For example, during the write operation, data transmitted from the memory controller 20 to the semiconductor memory device 10 is temporarily stored. During the read operation, data transmitted from the semiconductor memory device 10 to the memory controller 20 is temporarily stored. The transmission parity check circuit 12b in the input/output circuit 12 will be described below.

The logic control circuit 13 receives a control signal from the memory controller 20 via an input/output terminal (or a NAND bus). The control signal includes, for example, a chip enable signal CEn, a command latch enable signal CLE, an address latch enable signal ALE, a write enable signal WEn, a read enable signal REn, and a write-protect signal WPn. "n" added to the name of a signal represents that the signal is active-low.

The chip enable signal CEn is asserted when one semiconductor memory device 10 is selected from the plurality of semiconductor memory devices 10. The command latch enable signal CLE can latch a command to be transmitted as the signal DQ in the command register 15C. The address latch enable signal ALE can latch an address to be transmitted as the signal DQ in the address register 15B. The write enable signal WEn can store data to be transmitted as the signal DQ in the data register 19B. The read enable signal REn can output data read from the memory cell array 11 as the signal DQ. The write-protect signal WPn is asserted when the write operation and the erase operation on the semiconductor memory device 10 are prohibited.

The ready/busy circuit 14 generates a ready/busy signal R/Bn according to control from the sequencer 16. The ready/busy signal R/Bn represents whether the semiconductor memory device 10 is in a ready state or a busy state. The ready state represents a state where the semiconductor memory device 10 can receive a command from the memory controller 20. The busy state represents a state where the semiconductor memory device 10 cannot receive a command from the memory controller 20. By receiving the ready/busy signal R/Bn from the semiconductor memory device 10, the memory controller 20 can grasp whether the semiconductor memory device 10 is in the busy state or the ready state.

The status register 15A stores status information STS required for the operation of the semiconductor memory device 10. The status register 15A transmits the status information STS to the input/output circuit 12 according to an instruction of the sequencer 16. The status information STS includes a transmission status and a verification status. The transmission status and the verification status will be described below.

The address register 15B stores an address ADD transmitted from the input/output circuit 12. The address ADD includes a row address and a column address. The row address includes, for example, a block address that designates the block BLKn as an operation target and a page address that designates the word line WL (for example, a page) as an operation target in the designated block.

The command register 15C stores a command CMD transmitted from the input/output circuit 12. The command CMD includes, for example, a write command for instructing the sequencer 16 to execute the write operation, a read command for instructing the sequencer 16 to execute the read operation, and an erase command for instructing the sequencer 16 to execute the erase operation.

As the status register 15A, the address register 15B, and the command register 15C, for example, a static random access memory (SRAM) is used.

The sequencer 16 receives a command from the command register 15C, and comprehensively controls the semiconductor memory device 10 according to a sequence based on the command.

The sequencer 16 controls the voltage generation circuit 17, the row decoder 18, the column decoder 19A, the data register 19B, the sense amplifier 19C, and the like to execute the write operation, the read operation, and the erase operation. Specifically, the sequencer 16 writes data into the plurality of memory cell transistors designated by the address ADD based on the write command received from the command register 15C. The sequencer 16 reads data from the plurality of memory cell transistors designated by the address ADD based on the read command received from the command register 15C. The sequencer 16 erases data stored in the block designated by the address ADD based on the erase command received from the command register 15C.

The function of the sequencer 16 described in the specification may be implemented by the sequencer 16 executing software (or firmware) or may be implemented by hardware (or a dedicated circuit).

The voltage generation circuit 17 receives a power supply voltage VDD and a ground voltage VSS from the outside of the semiconductor memory device 10 through a power supply terminal. The power supply voltage VDD is an external voltage supplied from the outside of the semiconductor memory device 10 and is, for example, 3.3 V. The ground voltage VSS is an external voltage supplied from the outside of the semiconductor memory device 10 and is, for example, 0 V.

The voltage generation circuit 17 generates a plurality of voltages required for the write operation, the read operation, and the erase operation using the power supply voltage VDD. The voltage generation circuit 17 supplies the generated voltages to the memory cell array 11, the row decoder 18, the sense amplifier 19C, and the like.

The row decoder 18 receives a row address from the address register 15B and decodes the received row address. The row decoder 18 selects any block from the plurality of blocks based on the decoding result of the row address, and further selects the word line WL in the selected block BLKn. The row decoder 18 transmits the plurality of voltages supplied from the voltage generation circuit 17 to the selected block BLKn.

The column decoder 19A receives a column address from the address register 15B and decodes the received column address. The column decoder 19A selects a latch circuit in the data register 19B based on the decoding result of the column address.

The data register 19B includes a plurality of latch circuits. The data register 19B temporarily stores data during each of the write operation and the read operation.

During the read operation of data, the sense amplifier 19C senses and amplifies data read from the memory cell transistor to the bit line. The sense amplifier 19C temporarily stores data read from the memory cell transistor, and transmits the stored data to the data register 19B. During the write operation of data, the sense amplifier 19C temporarily stores data transmitted from the cache register 12a of the input/output circuit 12 through the data register 19B. The sense amplifier 19C transmits the stored data to the bit line.

1.1.2.1 Memory Cell Array

Next, a circuit configuration and a structure of the memory cell array 11 in the semiconductor memory device 10 according to the first embodiment will be described.

Figure 3:
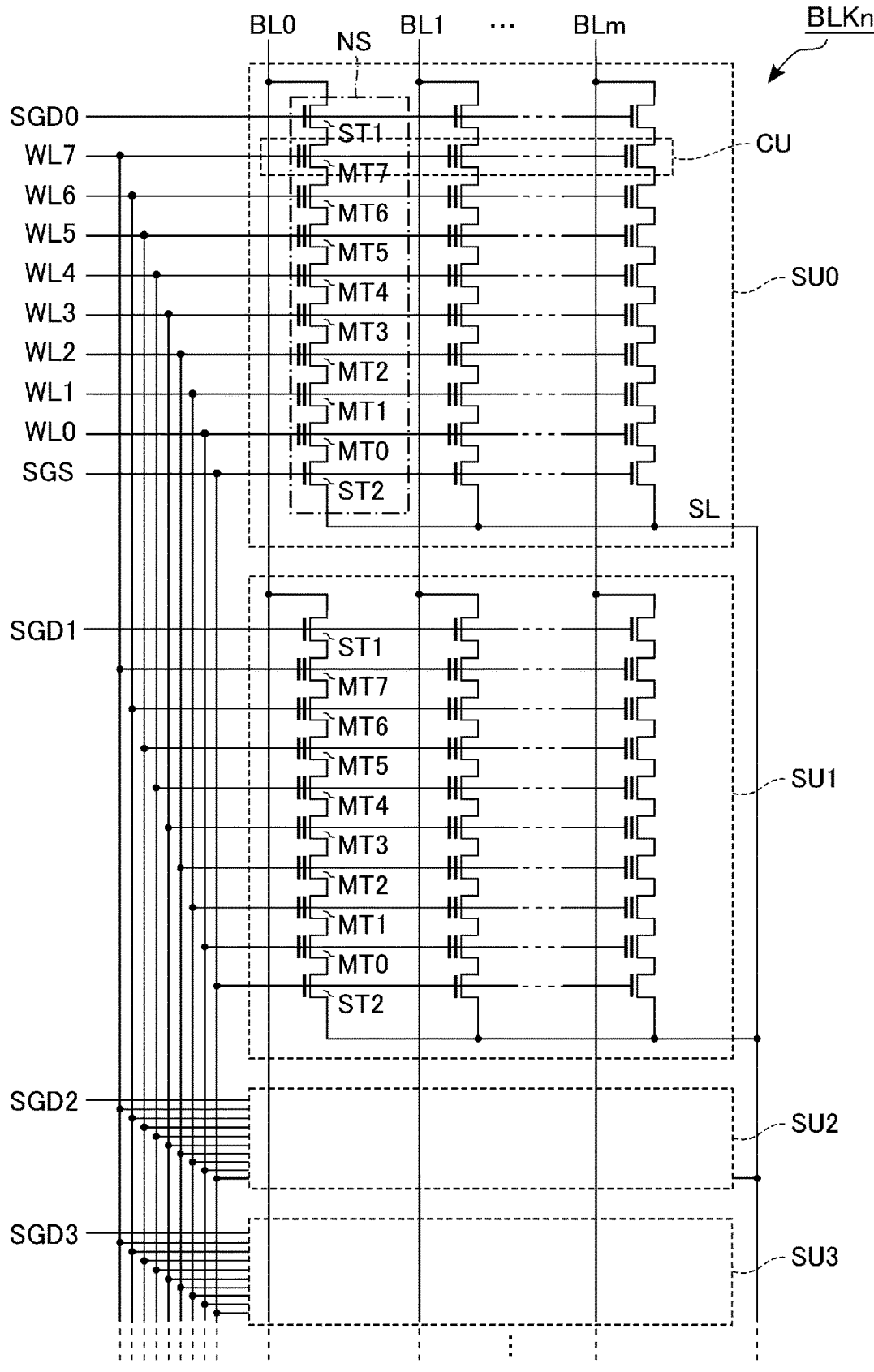
FIG. 3 is a circuit diagram illustrating a block in a memory cell array according to the first embodiment.

As described above, the memory cell array 11 includes the plurality of blocks BLK0 to BLKn. Hereinafter, a circuit configuration of the block BLKn will be described. FIG. 3 is a circuit diagram illustrating the block BLKn in the memory cell array 11.

The block BLKn includes, for example, a plurality of string units SU0, SU1, SU2, and SU3. Hereinafter, when the string unit SU is described, the string unit SU will refer to each of the string units SU0 to SU3. The string unit SU includes a plurality of NAND strings (or memory strings) NS.

Here, to facilitate the description, an example where the NAND string NS includes, for example, eight memory cell transistors MT0, MT1, MT2, . . . , and MT7 and two select transistors ST1 and ST2 will be described. Hereinafter, when the memory cell transistor MT is described, the memory cell transistor MT will refer to each of the memory cell transistors MT0 to MT7.

The memory cell transistor MT includes a control gate and a charge storage layer and stores data in a nonvolatile manner. The memory cell transistors MT0 to MT7 are connected in series between a source of the select transistor ST1 and a drain of the select transistor ST2. The memory cell transistor MT can store one-bit data or data of two bits or more.

The gates of the plurality of select transistors ST1 in the string unit SU0 are connected to a select gate line SGD0. Likewise, gates of the select transistors ST1 in the string units SU1 to SU3 are connected to select gate lines SGD1 to SGD3, respectively. Each of the select gate lines SGD0 to SGD3 is individually controlled by the row decoder 18.

Gates of the plurality of select transistors ST2 in the string unit SU0 are connected to a select gate line SGS. Likewise, gates of the select transistors ST2 in the string units SU1 to SU3 are connected to the select gate line SGS. Individual select gate lines SGS may be connected to the gates of the select transistors ST2 of the string units SU0 to SU3, respectively. The select transistors ST1 and ST2 are used for selection of the string unit SU in various operations.

Control gates of the memory cell transistors MT0 to MT7 in the block BLKn are connected to word lines WL0 to WL7, respectively. Each of the word lines WL0 to WL7 is individually controlled by the row decoder 18.

Bit lines BL0, BL1, BL2, . . . , BLm (m represents an integer of 0 or more) are connected to the plurality of blocks BLK0 to BLKn, respectively, and are connected to one NAND string NS in one string unit SU in the block BLKn. That is, the bit lines BL0 to BLm are connected to the drains of the select transistors ST1 of the plurality of NAND strings NS in the same column among the NAND strings NS located in a matrix configuration in the block BLKn. The source line SL is connected to the plurality of blocks BLK0 to BLKn. That is, the source line SL is connected to sources of the plurality of select transistors ST2 in the block BLKn.

In conclusion, the string unit SU includes a plurality of NAND strings NS that are connected to different bit lines BL and the same select gate line SGD. The block BLKn includes the plurality of string units SU that share the word line WL. The memory cell array 11 includes the plurality of blocks BLK0 to BLKn that share the bit line BL.

The block BLKn is, for example, a unit of erasing data. That is, data stored in the memory cell transistors MT in the block BLKn is collectively erased. Data in the plurality of blocks is sequentially erased on a one block basis. Data may be erased in units of the string units SU or may be erased in units less than string units SU.

The plurality of memory cell transistors MT that share the word line WL in one string unit SU will be referred to as a cell unit CU. A collection of one-bit data stored in each of the plurality of memory cell transistors MT in the cell unit CU will be referred to as a page. The cell unit CU changes storage capacity depending on the number of bits in data stored in the memory cell transistor MT. For example, the cell unit CU stores one-page data when each of the memory cell transistors MT stores one-bit data, stores two-page data when each of the memory cell transistors MT stores two-bit data, and stores three-page data when each of the memory cell transistors MT stores three-bit data.

The write operation and the read operation on the cell unit CU are executed in units of pages. In other words, the read operation and the write operation are collectively executed on the plurality of memory cell transistors MT that are connected in common to one word line WL disposed in one string unit SU.

The number of string units in the block BLKn is not limited to SU0 to SU3, and can be freely set. The number of NAND strings NS in the string unit SU and the numbers of memory cell transistors and select transistors in the NAND string NS can also be freely set. The memory cell transistors MT may be a metal-oxide-nitride-oxide-silicon (MONOS) type in which an insulating film is used as a charge storage layer, or may be a floating gate (FG) type in which a conductive layer is used as a charge storage layer.

Next, an example of a structure of the memory cell array 11 in the semiconductor memory device 10 according to the first embodiment will be described. Hereinafter, as an example of the memory cell array 11, a three-dimensionally stacked NAND flash memory where memory cell transistors are three-dimensionally stacked above a semiconductor substrate will be described.

In the drawings that will be referred to below, an X direction corresponds to an extending direction of the word lines WL. A Y direction corresponds to an extending direction of the bit line BL. A Z direction corresponds to a direction perpendicular to a surface of a semiconductor substrate on which the semiconductor memory device 10 is to be formed. A hatched area in a plan view does not necessarily relate to a material or characteristics of a hatched component. In the specification, a component such as a wiring, a contact, or an insulating layer is appropriately omitted to easily understand the drawing.

Figure 4:
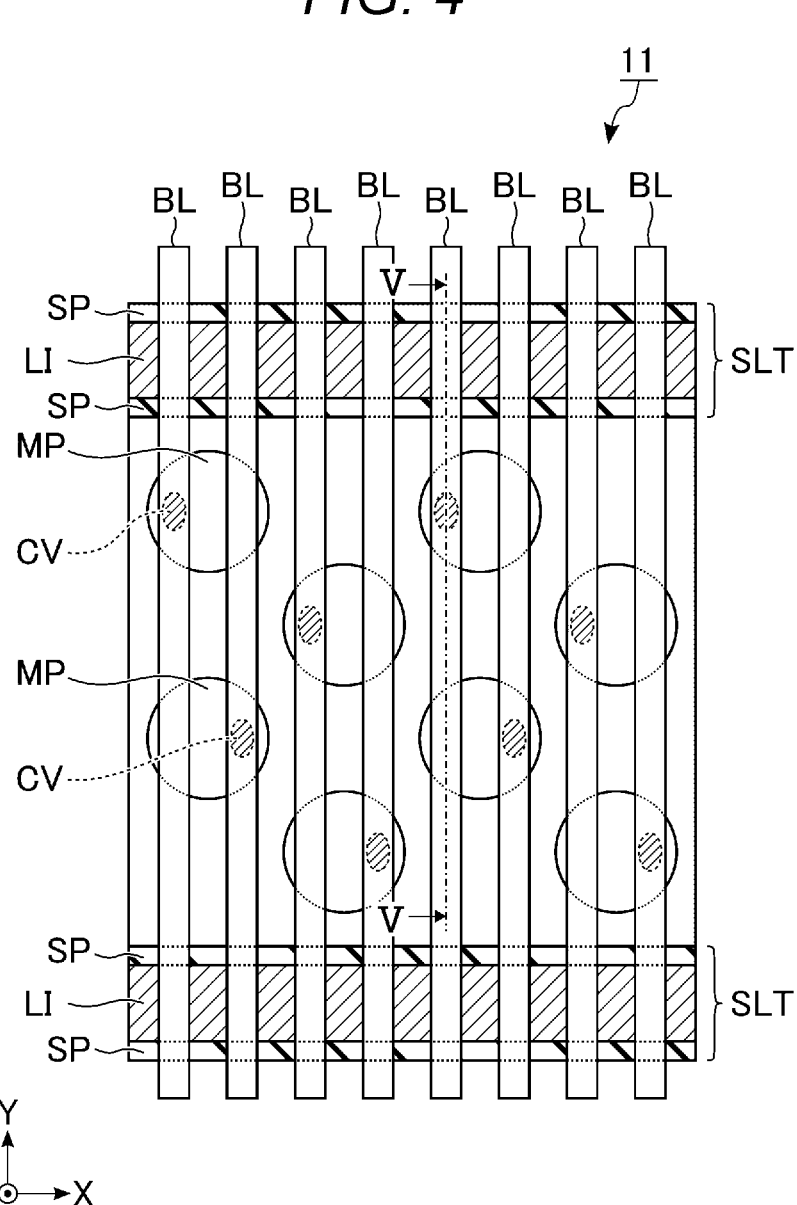
FIG. 4 is a diagram illustrating a part of a planar layout of the memory cell array according to the first embodiment.

First, an example of a planar layout of the memory cell array 11 will be described. FIG. 4 is a diagram illustrating a part of the planar layout of the memory cell array 11 according to the first embodiment.

The memory cell array 11 includes, for example, a plurality of slits SLT, a plurality of memory pillars MP, a plurality of contacts CV, and a plurality of bit lines BL.

The plurality of slits SLT are located in the Y direction. At least a part of each of the slits SLT extends in the X direction. The slits SLT are provided in the same wiring layer, and adjacent conductive layers are separated from each other by the slits SLT. Specifically, for example, the slits SLT separate a plurality of wiring layers corresponding to the word lines WL0 to WL7 and the select gate lines SGD and SGS, respectively.

Each of the slits SLT includes, for example, a spacer SP and a contact LI. In each of the slits SLT, at least a part of the contact LI extends in the X direction. The spacer SP is provided on a side surface of the contact LI. The contact LI and the plurality of wiring layers adjacent to the slits SLT are isolated and insulated from each other by the spacer SP. The contact LI is used as the source line SL. The contact LI may be a semiconductor or may be metal. The spacer SP includes, for example, silicon oxide (SiO₂).

Each of the memory pillars MP functions as, for example, one NAND string NS. For example, in a region between two adjacent slits SLT, the plurality of memory pillars MP are located in a staggered arrangement of four columns. However, the embodiment is not limited thereto, and the number and the arrangement of memory pillars MP between the two adjacent slits SLT can be appropriately changed.

In each of the memory pillars MP, at least one bit line BL overlaps the memory pillar MP. The plurality of bit lines BL are located in the X direction. At least a part of each of the bit lines BL extends in the Y direction. One bit line BL among the plurality of bit lines BL that overlap the memory pillar MP is electrically connected to the memory pillar MP through the contact CV.

The planar layout of the memory cell array 11 is repeatedly located in the Y direction. Each of regions divided by the slits SLT corresponds to one string unit SU. That is, a set including the string units SU0 to SU3 each extending in the X direction is located in the Y direction. One contact CV is connected to one bit line BL, for example, in each of spaces divided by the slits SLT.

Figure 5:
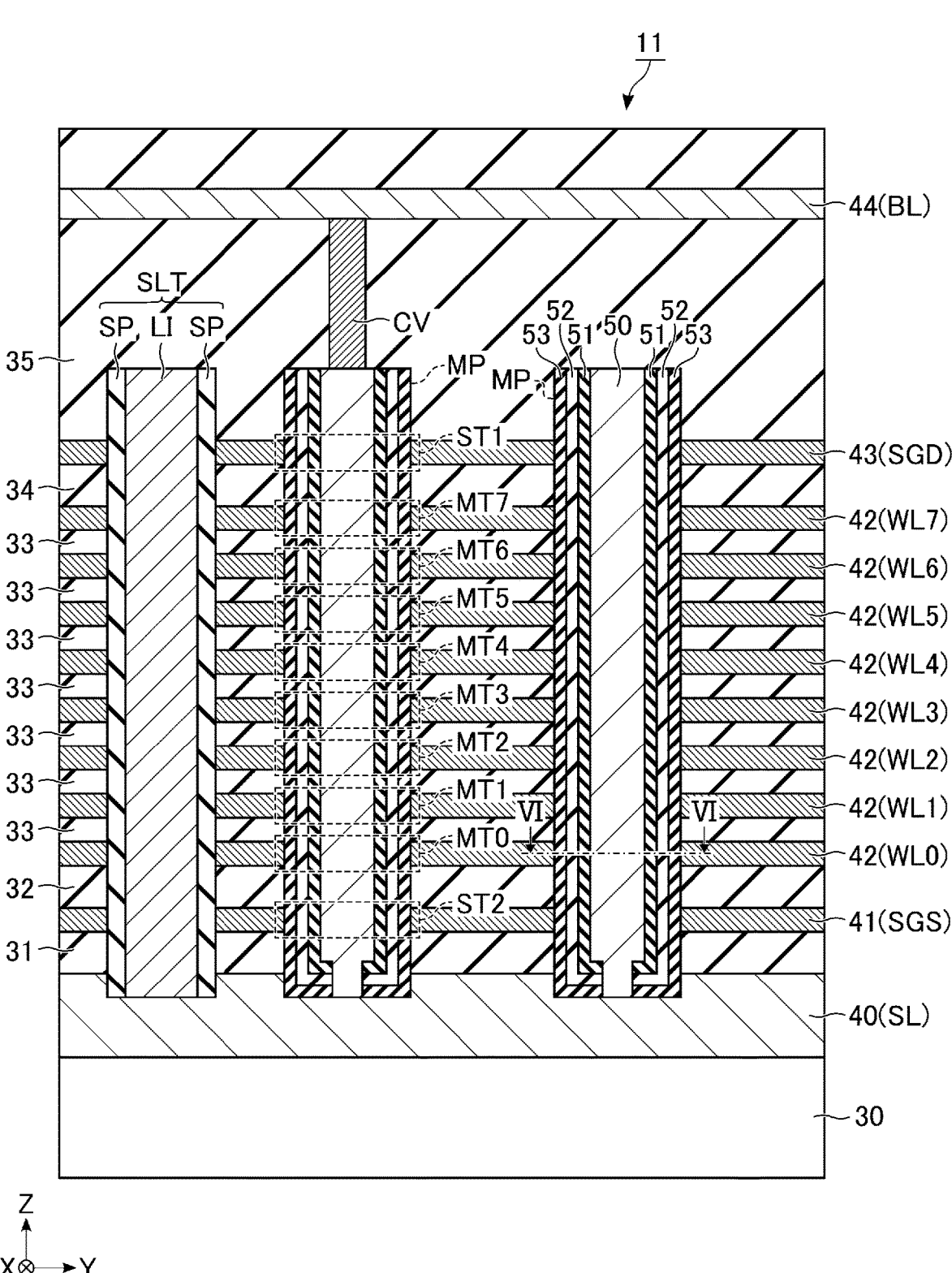
FIG. 5 is a cross-sectional view illustrating the memory cell array according to the first embodiment.

Next, an example of a cross-sectional structure of the memory cell array 11 will be described. FIG. 5 illustrates a cross-section taken along line V-V in FIG. 4, and illustrates a cross-section including the memory pillar MP and the slit SLT and taken in the Y direction.

The memory cell array 11 includes a semiconductor substrate 30, insulating layers 31 to 35, conductive layers 40 to 44, the memory pillar MP, the contact CV, and the slit SLT.

The conductive layer 40 is provided on the semiconductor substrate 30. The conductive layer 40 is formed, for example, in a plate shape spread along an XY plane and is used as the source line SL. The conductive layer 40 includes polysilicon doped with phosphorus.

The insulating layer 31 is provided on the conductive layer 40. The conductive layer 41 is provided on the insulating layer 31. The conductive layer 41 is formed, for example, in a plate shape spread along the XY plane and is used as the select gate line SGS. The conductive layer 41 includes, for example, polysilicon doped with phosphorus. The select gate line SGS may be configured with a plurality of conductive layers 41. When the select gate line SGS is configured with the plurality of conductive layers 41, the plurality of conductive layers 41 may be configured with conductors different from each other.

The insulating layer 32 is provided on the conductive layer 41. The conductive layer 42 and the insulating layer 33 are alternately stacked on the insulating layer 32. Each of a plurality of conductive layers 42 is formed, for example, in a plate shape spread along the XY plane. The plurality of conductive layers 42 are used as the word lines WL0 to WL7, respectively, in order from the conductive layer 40 side. The conductive layer 42 includes, for example, tungsten.

The insulating layer 34 is provided on the conductive layer 42 as the uppermost layer. The conductive layer 43 is provided on the insulating layer 34. The conductive layer 43 is formed, for example, in a plate shape spread along the XY plane and is used as the select gate line SGD. The select gate line SGD may be configured with a plurality of conductive layers 43. The conductive layer 43 includes, for example, tungsten.

The insulating layer 35 is provided on the conductive layer 43. The conductive layer 44 is provided on the insulating layer 35. The conductive layer 44 is formed, for example, in a linear shape extending in the Y direction and is used as the bit line BL. In a region not illustrated, a plurality of conductive layers 44 are located in the X direction. The conductive layer 44 includes, for example, copper.

Each of the memory pillars MP extends in the Z direction. Each of the memory pillars MP penetrate the insulating layers 31 to 34 and the conductive layers 41 to 43. The lower portion of the memory pillar MP is in contact with the conductive layer 40. The upper portion of the memory pillar MP reaches the insulating layer 35.

Each of the memory pillars MP includes, for example, a semiconductor layer 50, a tunnel insulating layer (also referred to as a tunnel insulating film) 51, a charge storage layer (for example, insulating layer) 52, and a block insulating layer 53.

The semiconductor layer 50 extends in the Z direction. For example, a lower end of the semiconductor layer 50 is in contact with the conductive layer 40. An upper end of the semiconductor layer 50 is provided in a layer including the insulating layer 35. The tunnel insulating layer 51 is disposed on a side surface of the semiconductor layer 50. The charge storage layer 52 is disposed on a side surface of the tunnel insulating layer 51. The block insulating layer 53 is disposed on a side surface of the charge storage layer 52.

A portion where the memory pillar MP and the conductive layer 41 (that is, the select gate line SGS) intersect with each other functions as the select transistor ST2. Portions where the memory pillar MP and the plurality of conductive layers 42 (that is, the word lines WL) intersect with each other function as the memory cell transistors MT0 to MT7, respectively. A portion where the memory pillar MP and the conductive layer 43 (that is, the select gate line SGD) intersect with each other functions as the select transistor ST1. That is, the semiconductor layer 50 functions as a channel layer of each of the memory cell transistors MT0 to MT7 and the select transistors ST1 and ST2. In the semiconductor layer 50, a current path of the NAND string NS is formed. The charge storage layer 52 functions as a layer that stores charge of the memory cell transistor MT.

The columnar contact CV is provided on the semiconductor layer 50 of each of the memory pillars MP. In an illustrated region, the contact CV corresponding to one memory pillar MP among two memory pillars MP is provided. The memory pillar MP to which the contact CV is not connected in the illustrated region is connected to the contact CV in a region not illustrated. One conductive layer 44 (that is, the bit line BL) is in contact with the contact CV.

The slit SLT includes, for example, the spacer SP and the contact LI. The slit SLT is formed in a plate shape at least a part of which spreads along an XZ plane, and separates the insulating layers 31 to 34 and the conductive layers 41 to 43. A lower end of the slit SLT is in contact with, for example, the conductive layer 40. An upper end of the slit SLT is provided in a layer including the insulating layer 35. In the slit SLT, at least a part of the contact LI extends in the X direction. The spacer SP is provided on a side surface of the contact LI. The contact LI and the plurality of conductive layers 41 to 43 are isolated and insulated from each other by the spacer SP.

Figure 6:
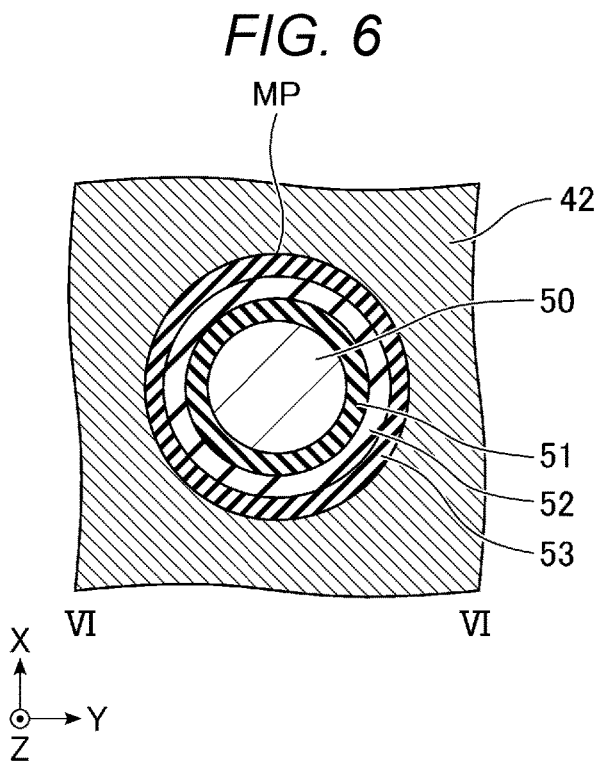
FIG. 6 is a cross-sectional view illustrating a memory pillar in the memory cell array according to the first embodiment.

Next, a cross-sectional structure of the memory pillar MP in the memory cell array 11 will be described. FIG. 6 illustrates a cross-section taken along line VI-VI in FIG. 5, and illustrates a cross-section of the memory pillar MP in a layer that is parallel to the surface of the semiconductor substrate 30 and includes the conductive layer 42.

As described above, the memory pillar MP includes, for example, the semiconductor layer 50, the tunnel insulating layer 51, the charge storage layer 52, and the block insulating layer 53. Specifically, the semiconductor layer 50 is provided, for example, in the center portion of the memory pillar MP. The tunnel insulating layer 51 surrounds the side surface of the semiconductor layer 50. The charge storage layer 52 surrounds the side surface of the tunnel insulating layer 51. The block insulating layer 53 surrounds the side surface of the charge storage layer 52. The conductive layer 42 surrounds a side surface of the block insulating layer 53. The memory pillar MP may have a structure where a core insulating layer is provided in the semiconductor layer 50.

When charge is injected into the charge storage layer 52 from the semiconductor layer 50 or when charge stored in the charge storage layer 52 is diffused to the semiconductor layer 50, the tunnel insulating layer 51 functions as a potential barrier. The tunnel insulating layer 51 includes, for example, silicon oxide ($SiO_2$).

The charge storage layer 52 has a function of storing the charge injected from the semiconductor layer 50 in the memory cell transistors MT0 to MT7. The charge storage layer 52 includes, for example, silicon nitride (SiN).

The block insulating layer 53 prevents the charge stored in the charge storage layer 52 from being diffused to the conductive layer 42 (word line WL). The block insulating layer 53 includes, for example, an aluminum oxide layer, a silicon oxide layer, or a silicon nitride layer.

1.1.3 Threshold Voltage Distribution of Memory Cell Transistor

Figure 7:
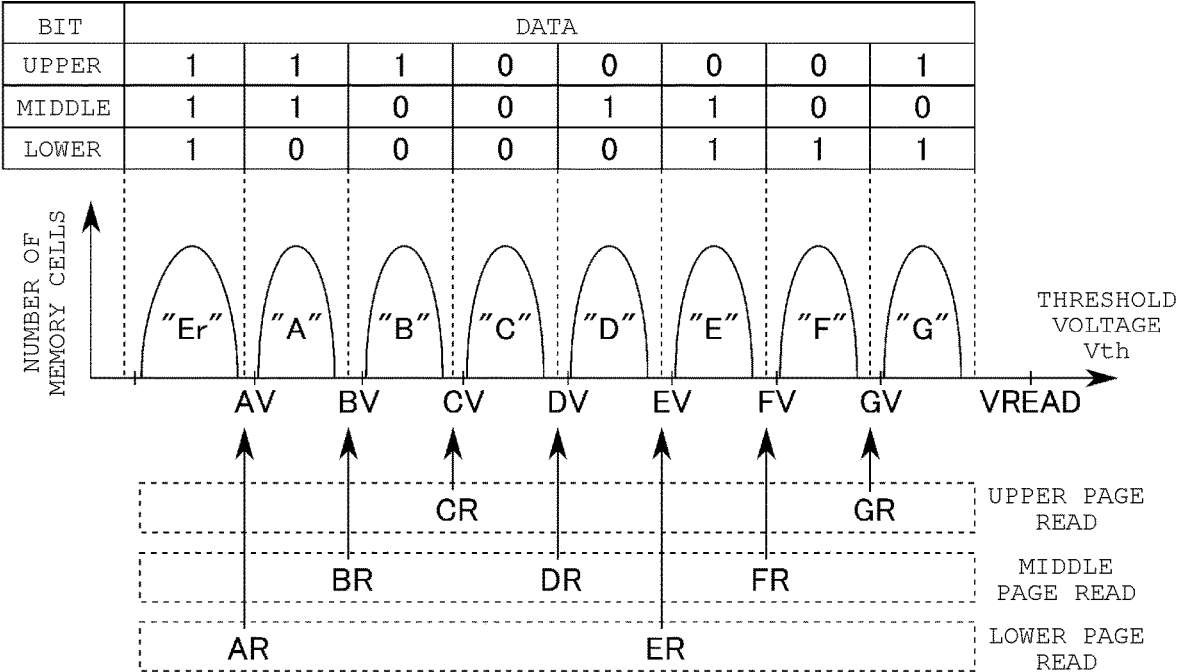
FIG. 7 is a diagram illustrating a relationship between a threshold voltage distribution of the memory cell transistor according to the first embodiment and data.

Next, a relationship between data and a threshold voltage distribution that can be adopted in the memory cell transistor MT will be described. FIG. 7 is a diagram illustrating the relationship between data and threshold voltage distribution that can be adopted in the memory cell transistor MT.

Here, an example where a triple-level cell (TLC) type in which one memory cell transistor MT can store three-bit data is applied as a storage type of the memory cell transistor MT will be described. The embodiment is also applicable to a case where another storage type is used, for example, a single-level cell (SLC) type in which one memory cell transistor MT can store one-bit data, a multi-level cell (MLC) type in which one memory cell transistor MT can store two-bit data, or a quad-level cell (QLC) type in which one memory cell transistor MT can store four-bit data.

The three-bit data that can be stored in the memory cell transistor MT is defined by a lower bit, a middle bit, and an upper bit. When the memory cell transistor MT stores three bits, the memory cell transistor MT can adopt any state among eight states corresponding to a plurality of threshold voltages. The eight states will be referred to as states "Er", "A", "B", "C", "D", "E", "F", and "G" in ascending order. A plurality of memory cell transistors MT belonging to the states "Er", "A", "B", "C", "D", "E", "F", and "G", respectively, form a distribution of threshold voltages illustrated in FIG. 6.

For example, data "111", "110", "100", "000", "010", "011", "001", and "101" are allocated to the states "Er", "A", "B", "C", "D", "E", "F", and "G", respectively. When the lower bit is represented by "X", the middle bit is represented by "Y", and the upper bit is represented by "Z", the sequence of the bits is "Z, Y, X". The allocation between the threshold voltage distribution and data can be freely set.

To read data stored in the memory cell transistor as a read target, a state to which the threshold voltage of the memory cell transistor MT belongs is determined. To determine the state, read voltages AR, BR, CR, DR, ER, FR, and GR are used. Hereinafter, not only the read voltages AR, BR, CR, DR, ER, FR, and GR but also voltages that are applied to the memory cell transistor MT as a read target for determining the state will also be referred to as a read voltage VCGRV.

For example, the state "Er" corresponds to a state in which data is erased (erased state). The threshold voltage of the memory cell transistor MT belonging to the state "Er" is lower than the voltage AR and has, for example, a negative value.

The states "A" to "G" correspond to states where charge is injected into the charge storage layer and data is written into the memory cell transistor MT. The threshold voltage of the memory cell transistor MT belonging to each of the states "A" to "G" has, for example, a positive value. The threshold voltage of the memory cell transistor MT belonging to the state "A" is higher than the read voltage AR and is lower than or equal to the read voltage BR. The threshold voltage of the memory cell transistor MT belonging to the state "B" is higher than the read voltage BR and is lower than or equal to the read voltage CR. The threshold voltage of the memory cell transistor MT belonging to the state "C" is higher than the read voltage CR and is lower than or equal to the read voltage DR. The threshold voltage of the memory cell transistor MT belonging to the state "D" is higher than the read voltage DR and is lower than or equal to the read voltage ER. The threshold voltage of the memory cell transistor MT belonging to the state "E" is higher than the read voltage ER and is lower than or equal to the read voltage FR. The threshold voltage of the memory cell transistor MT belonging to the state "F" is higher than the read voltage FR and is lower than or equal to the read voltage GR. The threshold voltage of the memory cell transistor MT belonging to the state "G" is higher than the read voltage GR and is lower than a voltage VREAD.

The voltage VREAD is a voltage that is applied to the word line WL connected to the memory cell transistor MT of the cell unit CU as a non-reading target and is higher than the threshold voltage of the memory cell transistor MT in any of the states. Therefore, the memory cell transistor MT in which the voltage VREAD is applied to the control gate is in an ON state regardless of stored data.

Verification voltages used in the respective write operations are set between adjacent threshold voltage distributions. Specifically, verification voltages AV, BV, CV, DV, EV, FV, and GV are set to correspond to the states "A", "B", "C", "D", "E", "F", and "G". For example, the verification voltages AV, BV, CV, DV, EV, FV, and GV are set to be slightly higher than the read voltages AR, BR, CR, DR, ER, FR, and GR, respectively.

As described above, each memory cell transistor MT is set to be in any one of the eight states and can store three-bit data. The read operation and the write operation are executed in units of pages in one cell unit CU. When the memory cell transistor MT stores three-bit data, the lower bit, the middle bit, and the upper bit are allocated to three pages in one cell unit CU, respectively. Pages to be written during a single write operation or pages to be read during a single read operation for the lower bit, the middle bit, and the upper bit, that is, a set of lower bits, a set of middle bits, and a set of upper bits stored in the cell unit CU will be referred to as a lower page, a middle page, and an upper page.

When the allocation of the data is applied as described above, the lower page is determined by a read operation using the read voltages AR and ER. The middle page is determined by a read operation using the read voltages BR, DR and FR. The upper page is determined by a read operation using the read voltages CR and GR.

1.1.4 ECC Circuit of Memory Controller

As described above, the memory controller 20 includes the ECC circuit 24. The ECC circuit 24 executes generation of data for error detection and detection and correction of error using the data for error detection on data to be written into the semiconductor memory device 10 and data read from the semiconductor memory device 10.

The ECC circuit 24 includes the first ECC circuit 24a and the second ECC circuit 24b. The first ECC circuit 24a executes, for example, generation of data for error detection and detection and correction of error based on soft decision such as low-density parity check (LDPC) or generation of data for error detection and detection and correction of error based on hard decision such as BCH code or Reed-Solomon code. The second ECC circuit 24b executes, for example, generation of data for error detection and detection of error using a parity bit (or a parity code). The parity bit is a flag indicating whether the number of "1" in data is even or odd. The second ECC circuit 24b uses less power and time for computation of error detection, compared to the first ECC circuit 24a. In the second ECC circuit 24b, the computation load is lower than that of the first ECC circuit 24a that executes detection of memory error, but instead, the correction capability is lower than that of the first ECC circuit 24a. For example, calculation amount for generation of the data for error detection in the first ECC circuit 24a is higher than calculation amount for generation of the parity bit in the second ECC circuit 24b. The error detection and correction method of the first ECC circuit 24a is not limited to the above-described method, and another error detection and correction method may be used. The error detection and correction method of the second ECC circuit 24b is also not limited to the above-described method, and another error detection and correction method may be used.

The first ECC circuit 24a and the second ECC circuit 24b generate data for error detection for data to be written into the semiconductor memory device 10. Data including the generated data for error detection is transmitted to the semiconductor memory device 10. The first ECC circuit 24a and the second ECC circuit 24b detect error occurring in data using the data for error detection and corrects the error for data read from the semiconductor memory device 10 and transmitted to the memory controller 20.

Figure 8A:
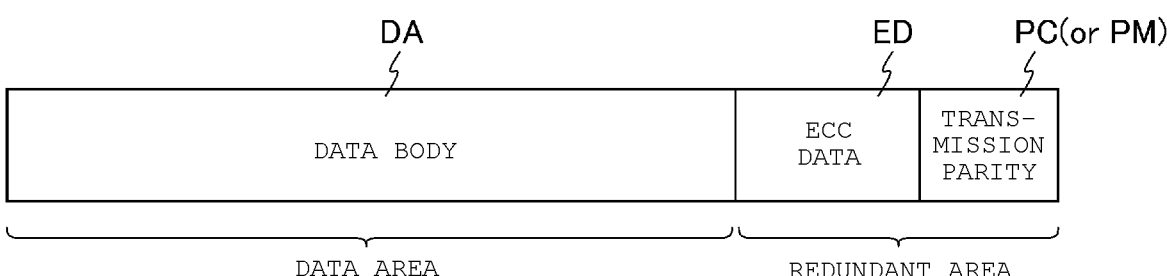
FIGS. 8A and 8B are diagrams illustrating a data structure of transmission data, write data, and read data according to the first embodiment.

FIG. 8A illustrates a data structure of data that is transmitted and received between the memory controller 20 and the semiconductor memory device 10 in the first embodiment. Hereinafter, the data that is transmitted and received between the memory controller 20 and the semiconductor memory device 10 will be referred to as transmission data. The transmission data includes a data area and a redundant area. The data area includes a data body DA. The redundant area includes ECC data ED and a parity bit. The parity bit generated by the second ECC circuit 24b of the memory controller 20 will be referred to as a transmission parity PC, and the parity bit generated by the transmission parity check circuit 12b of the semiconductor memory device 10 will be referred to as a transmission parity PM. The transmission data to be transmitted from the memory controller 20 to the semiconductor memory device 10 includes the data body DA, the ECC data ED, and the transmission parity PC. The transmission data to be received by the memory controller 20 from the semiconductor memory device 10 includes the data body DA, the ECC data ED, and the transmission parity PM.

The ECC data ED is, for example, 8n bits (n represents a natural number). The transmission parity PC and the transmission parity PM are, for example, 8m bits (m represents a natural number). Generally, the number of bits in the ECC data ED is more than those of the transmission parity PC and the transmission parity PM. n represents, for example, about several hundreds. m represents, for example, 1 or more and less than 10. As such, there is a difference between the ECC data ED and the transmission parities PC and PM because, by optimizing the error detection and correction capability depending on the error occurrence probability, the error detection and correction capability of the ECC circuit 24 can be improved while preventing an increase in the ECC circuit 24.

The data body DA is target data to be written into the memory cell array 11 in the semiconductor memory device 10 by the memory controller 20. The ECC data ED is data for error detection generated by LDPC or the like by the first ECC circuit 24a for the data body DA. The transmission parity PC is data for error detection generated by the second ECC circuit 24b for the data body DA and the ECC data ED. The transmission parity PM is data for error detection generated by transmission parity check circuit 12b for the data body DA and the ECC data ED. The transmission parities PC and PM are used for detecting error occurring during the transmission and reception of the transmission data between the memory controller 20 and the semiconductor memory device 10.

Figure 8B:
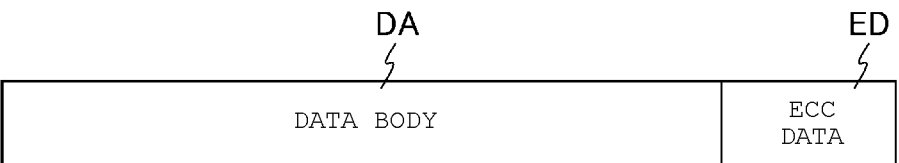

FIG. 8B illustrates data to be written into the memory cell array 11 in the semiconductor memory device 10 and data read from the memory cell array 11. The data to be written into the memory cell array 11 is the data body DA and the ECC data ED, excluding the transmission parity PC. Likewise, the data read from the memory cell array 11 is also the data body DA and the ECC data ED, excluding the transmission parity PC. Hereinafter, the data to be written into the memory cell array 11 in the semiconductor memory device 10 will be referred to as "write data", and the data read from the memory cell array 11 will be referred to as "read data". That is, each of the write data and the read data includes the data body DA and the ECC data ED and does not include the transmission parity PC. The transmission parity PC transmitted from the memory controller 20 to the semiconductor memory device 10 may be received by the cache register 12a in the input/output circuit 12, may be received by the transmission parity check circuit 12b, and may be further received by the data register 19B.

Figure 9:
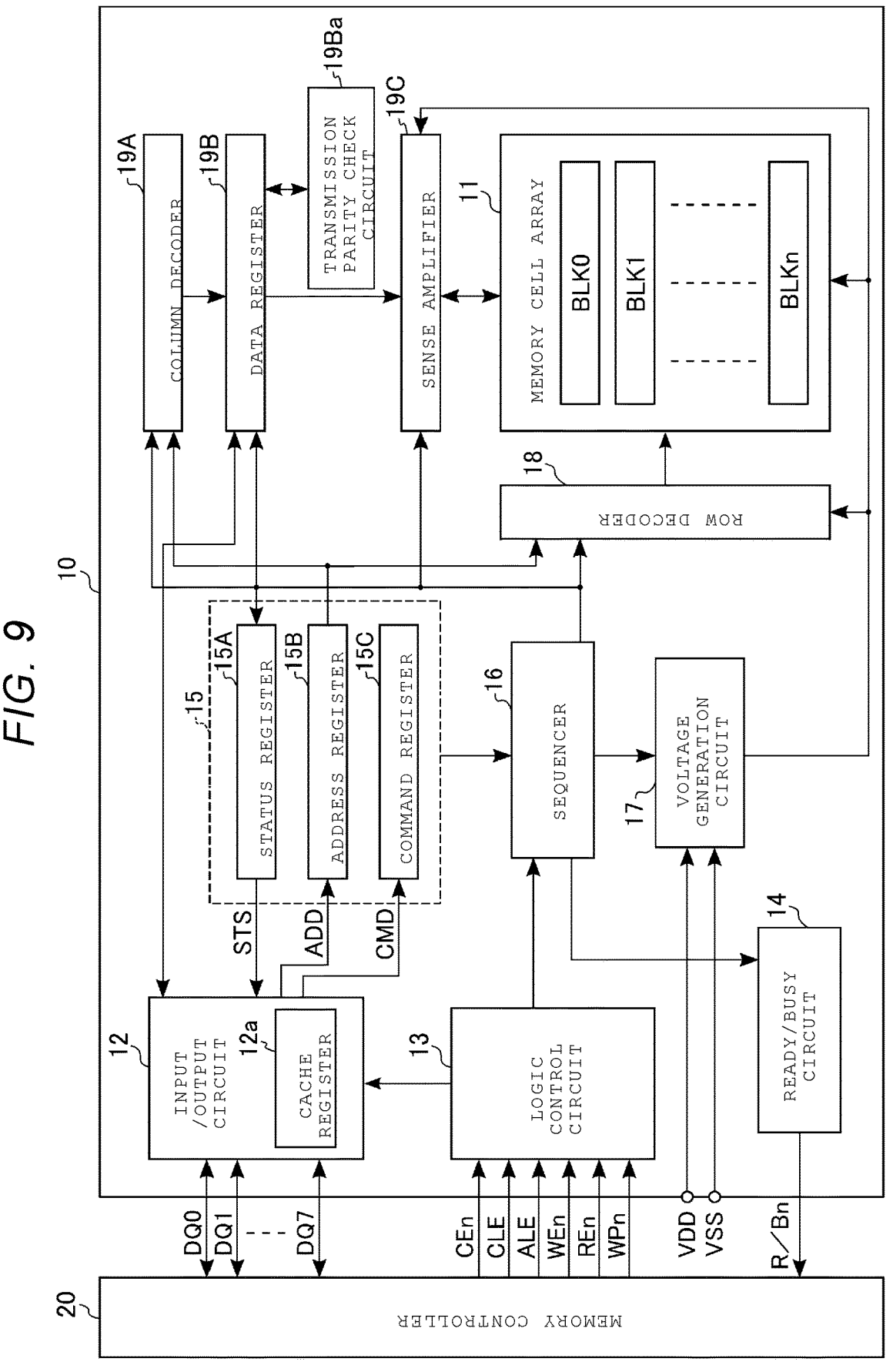
FIG. 9 is a block diagram illustrating a modification example of a configuration of the semiconductor memory device according to the first embodiment.

The transmission parity check circuit 12b may be provided in the vicinity of the data register 19B. As illustrated in FIG. 9, the transmission parity check circuit provided in the vicinity of the data register 19B is represented by 19Ba. When the transmission parity check circuit 19Ba is provided in the vicinity of the data register 19B, the transmission parity PC may be received by the cache register 12a in the input/output circuit 12 or may be received by the data register 19B or the transmission parity check circuit 19Ba. The transmission parity check circuit 19Ba has the same configuration as the transmission parity check circuit 12b and, as in the second ECC circuit 24*b* in the memory controller 20, executes, for example, generation of data for error detection and detection of error using a parity bit.

During the read operation, the second ECC circuit 24*b* checks whether the generated transmission parity PC and the transmission parity PM generated by the transmission parity check circuit 12*b* match with each other.

An example of the matching check that is executed in the second ECC circuit 24*b* will be described. First, each of the bits of the transmission parity PC and the transmission parity PM is stored in a storage circuit and is input to an ENOR gate (matching circuit), respectively. Next, in the ENOR gate, when the input matches, "1" is output, and when the input does not match, "0" is output. Finally, when the output of each of the ENOR gates is input to an AND gate, when all the bits match and are "1", "1" is output, and when one or more bits do not match, "0" is output.

Another example of the matching check that is executed in the second ECC circuit 24*b* will be described. In the present example, the storage circuit is not used. The transmission parity PC and the transmission parity PM that flow serially one bit by one bit are sequentially input to a check circuit. When the input of all the bits regarding the transmission parity PC and the transmission parity PM ends, the check result is output.

1.1.5 ECC Circuit of Semiconductor Memory Device

As described above, the input/output circuit 12 of the semiconductor memory device 10 includes the transmission parity check circuit 12*b* as the ECC circuit. As in the second ECC circuit 24*b* in the memory controller 20, the transmission parity check circuit 12*b* executes, for example, generation of data for error detection and detection of error using a parity bit (or a parity code). The transmission parity check circuit 12*b* uses less power and time for computation of error detection, compared to the first ECC circuit 24*a*. In the transmission parity check circuit 12*b*, the computation load is lower than that of the first ECC circuit 24*a* that executes detection of memory error, but instead, the correction capability is lower than that of the first ECC circuit 24*a*. For example, calculation amount for generation of the data for error detection in the first ECC circuit 24*a* is higher than calculation amount for generation of the parity bit in the transmission parity check circuit 12*b*.

During the write operation, the transmission parity check circuit 12*b* generates the transmission parity PM for the data body DA and the ECC data ED in the transmission data transmitted from the memory controller 20. The transmission parity PM is data for error detection for detecting error occurring in the transmission data while the transmission data is being transmitted from the memory controller 20 to the semiconductor memory device 10.

During the write operation, the transmission parity check circuit 12*b* checks whether the generated transmission parity PM and the transmission parity PC generated by the second ECC circuit 24*b* match with each other.

An example of the matching check that is executed in the transmission parity check circuit 12*b* will be described. First, each of the bits of the transmission parity PM and the transmission parity PC is stored in a storage circuit and is input to an ENOR gate (matching circuit), respectively. Next, in the ENOR gate, when the input matches, "1" is output, and when the input does not match, "0" is output. Finally, when the output of each of the ENOR gates is input to an AND gate, when all the bits match and are "1", "1" is output, and when one or more bits do not match, "0" is output.

Another example of the matching check that is executed in the transmission parity check circuit 12*b* will be described. In the present example, the storage circuit is not used. The transmission parity PC and the transmission parity PM that flow serially one bit by one bit are sequentially input to the check circuit. When the input of all the bits regarding the transmission parity PC and the transmission parity PM ends, the check result is output.

During the read operation, the transmission parity check circuit 12*b* generates the transmission parity PM for the data body DA and the ECC data ED in the read data read from the memory cell array 11. The transmission parity check circuit 12*b* adds the transmission parity PM to the read data to generate transmission data. The transmission parity PM is data for error detection for detecting error occurring in the transmission data while the transmission data including the read data is being transmitted from the semiconductor memory device 10 to the memory controller 20.

The transmission parity check circuit 12*b* may execute only the generation of the data for error detection using the parity bit, and the sequencer 16 may execute the detection of error using the parity bit.

1.2 Write Operation of Memory System

During the write operation in the first embodiment, whether the transmission error occurred in the transmission data transmitted from the memory controller 20 to the semiconductor memory device 10 is checked, and when the transmission error occurred, the transmission data is transmitted again from the memory controller 20 to the semiconductor memory device 10. In parallel with the check of the transmission error, the write data in the transmission data is written into the memory cell array 11. When the transmission error does not occur, the previously transmitted transmission data is used. When the transmission error occurred, the transmission data to be subsequently transmitted is used. When memory error occurred in the write data, the address of the memory cell array 11 into which the write data is to be written changes, that is, the page in the block BLKn into which the write data is to be written changes.

The write operation includes a program operation and a program verification operation. The program operation is an operation of applying write voltage to a gate electrode of the memory cell transistor to inject charge into the charge storage layer 52 of the memory cell transistor such that the threshold voltage of the memory cell transistor increases. The program verification operation is a read operation of checking whether the threshold voltage of the memory cell transistor generated by the application of the write voltage reaches a target voltage.

Next, the flow of data in the write operation of the first embodiment will be described using FIGS. 10, 11, and 12.

Figure 10:
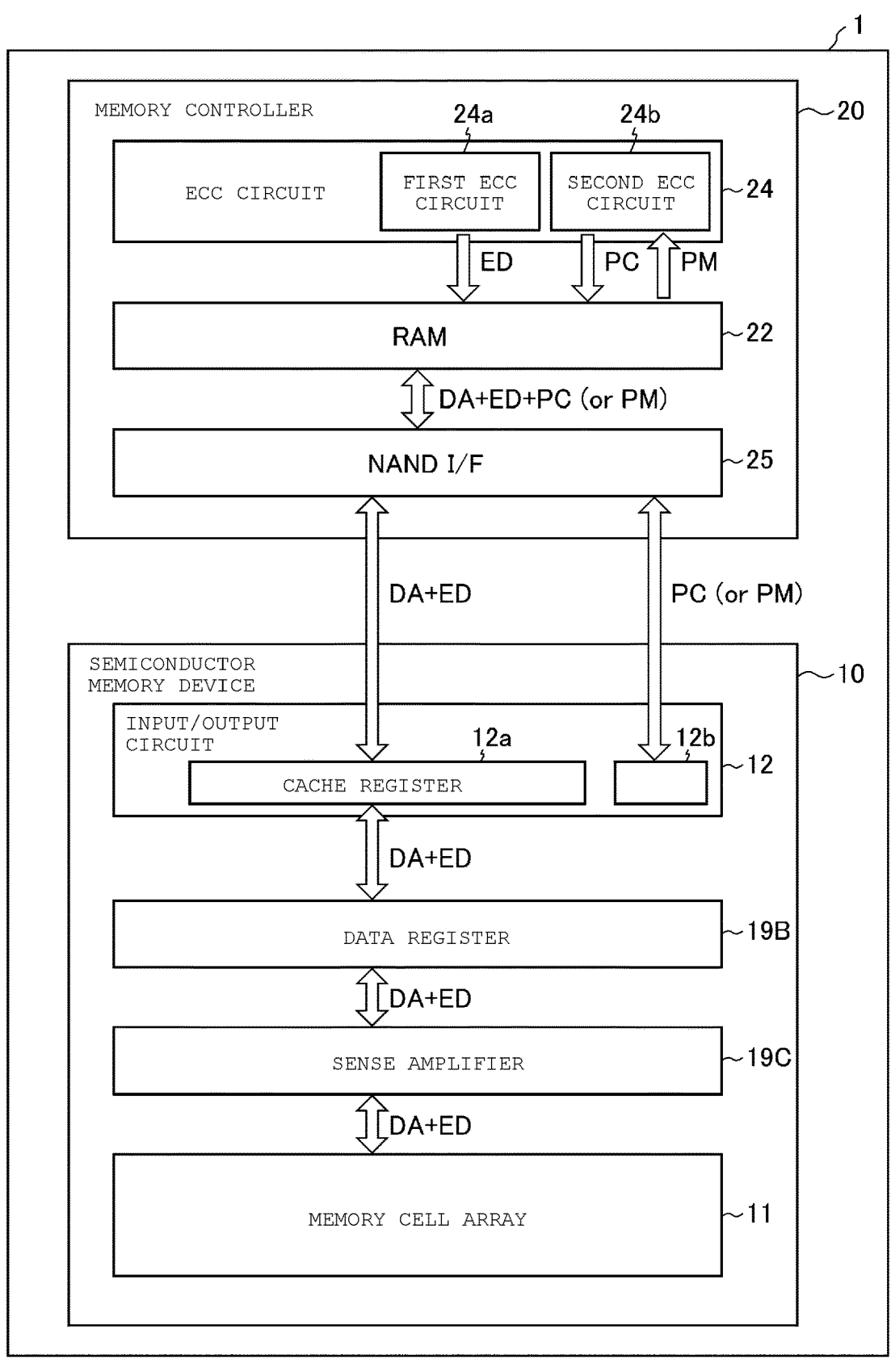
FIG. 10 is a diagram illustrating a first example of the flow of data in the memory system according to the first embodiment.

FIG. 10 illustrates a case where the transmission parity PC is stored in the transmission parity check circuit 12*b* in the input/output circuit 12 in the write operation of the first embodiment. The downward direction of the arrow in the drawing indicates the flow of data in the write operation.

The data body DA is stored in the RAM 22. For the data body DA, the ECC data ED is generated by the first ECC circuit 24*a* and transmitted to the RAM 22. For the data body DA and the ECC data ED, the transmission parity PC is generated by the second ECC circuit 24*b* and transmitted to the RAM 22.

Among the data body DA, the ECC data ED, and the transmission parity PC stored in the RAM 22, the data body DA and the ECC data ED are transmitted to the cache register 12*a* in the input/output circuit 12 through the NAND interface circuit 25 and temporarily stored therein, and the transmission parity PC is transmitted to the transmission parity check circuit 12b through the NAND interface circuit 25 and temporarily stored therein.

The transmission parity check circuit 12b generates the transmission parity PM for the data body DA and the ECC data ED stored in the cache register 12a. The transmission parity check circuit 12b checks whether the generated transmission parity PM and the transmission parity PC received from the NAND interface circuit 25 match with each other.

In the check, when the transmission parity PC and the transmission parity PM do not match with each other, the data body DA, the ECC data ED, and the transmission parity PC are transmitted again from the RAM 22 through the NAND interface circuit 25 or from the NAND interface circuit 25. Next, the data body DA and the ECC data ED stored in the cache register 12a are transmitted to the data register 19B and temporarily stored therein. The data body DA and the ECC data ED stored in the data register 19B are transmitted to the sense amplifier 19C and temporarily stored therein. The data body DA and the ECC data ED stored in the sense amplifier 19C are written into the memory cell array 11.

Figure 11:
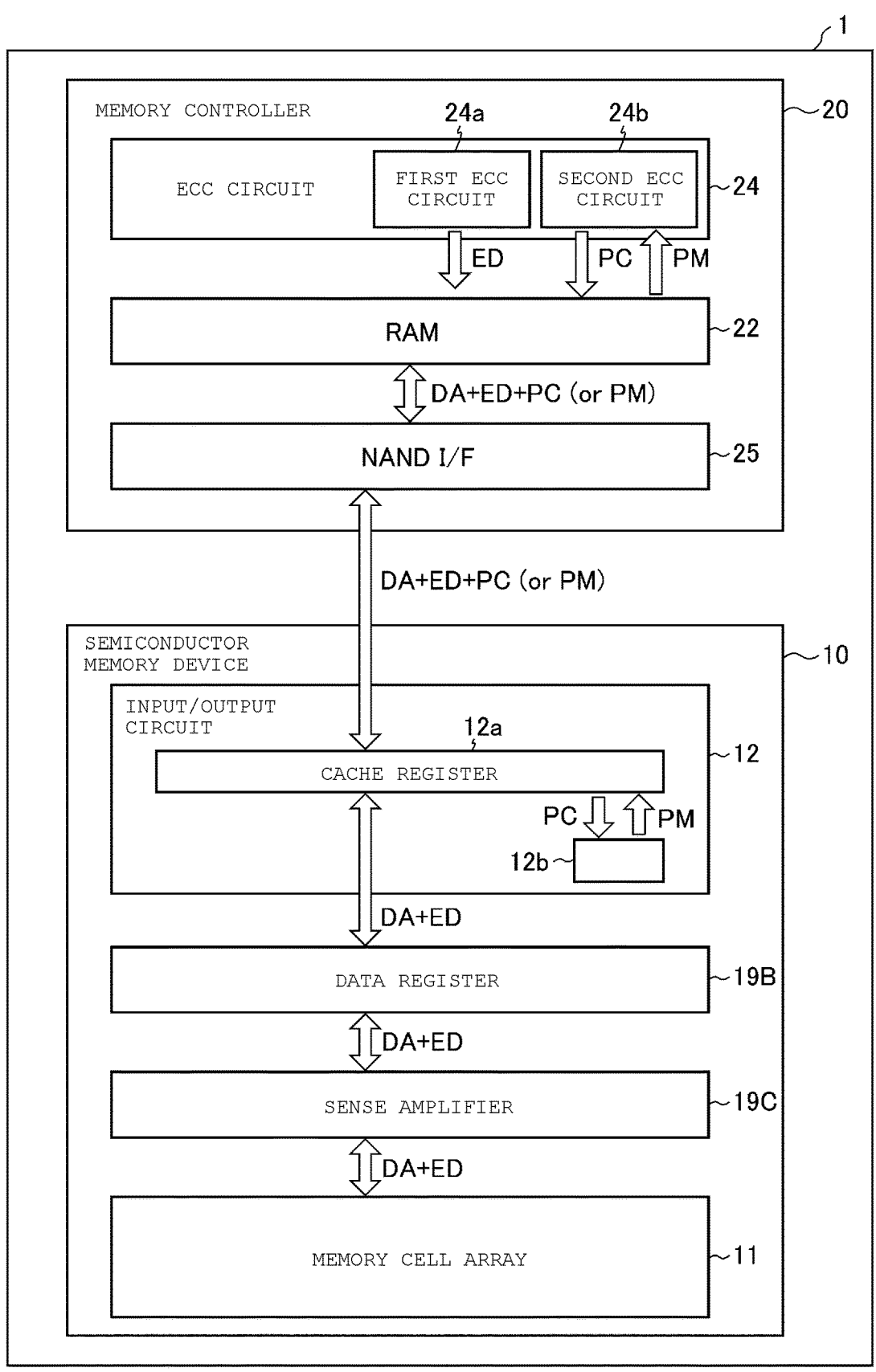
FIG. 11 is a diagram illustrating a second example of the flow of data in the memory system according to the first embodiment.

FIG. 11 illustrates a case where the transmission parity PC is stored in the cache register 12a in the input/output circuit 12 in the write operation of the first embodiment. The downward direction of the arrow in the drawing indicates the flow of data in the write operation.

The data body DA, the ECC data ED, and the transmission parity PC stored in the RAM 22 are transmitted to the cache register 12a in the input/output circuit 12 through the NAND interface circuit 25 and temporarily stored therein.

The transmission parity check circuit 12b generates the transmission parity PM for the data body DA and the ECC data ED stored in the cache register 12a. The transmission parity PC stored in the cache register 12a is transmitted to the transmission parity check circuit 12b. The transmission parity check circuit 12b checks whether the generated transmission parity PM and the transmission parity PC received from the cache register 12a match with each other.

In the check, when the transmission parity PC and the transmission parity PM do not match with each other, the data body DA, the ECC data ED, and the transmission parity PC are transmitted again from the RAM 22 through the NAND interface circuit 25 or from the NAND interface circuit 25.

Next, the data body DA and the ECC data ED stored in the cache register 12a excluding the transmission parity PC are transmitted to the data register 19B and temporarily stored therein. The data body DA and the ECC data ED stored in the data register 19B are transmitted to the sense amplifier 19C and temporarily stored therein. The data body DA and the ECC data ED stored in the sense amplifier 19C are written into the memory cell array 11.

Figure 12:
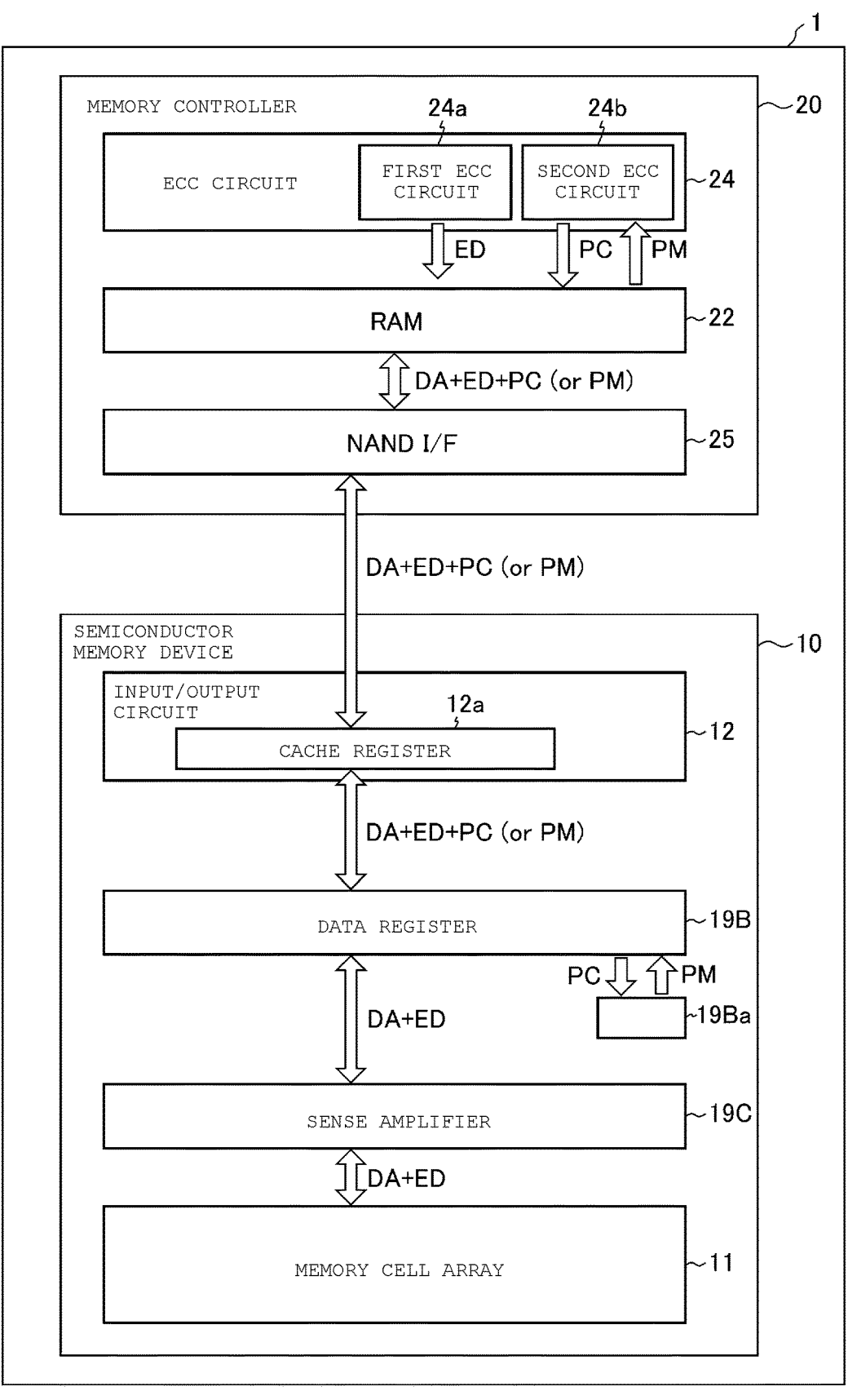
FIG. 12 is a diagram illustrating a third example of the flow of data in the memory system according to the first embodiment.

FIG. 12 illustrates a case where the transmission parity PC is stored in the data register 19B and the transmission parity PM is generated by the transmission parity check circuit 19Ba provided in the vicinity of the data register 19B in the write operation of the first embodiment. The downward direction of the arrow in the drawing indicates the flow of data in the write operation.

The data body DA, the ECC data ED, and the transmission parity PC stored in the RAM 22 are transmitted to the cache register 12a in the input/output circuit 12 through the NAND interface circuit 25 and temporarily stored therein. The data body DA, the ECC data ED, and the transmission parity PC stored in the cache register 12a are transmitted to the data register 19B and temporarily stored therein.

The transmission parity check circuit 19Ba generates the transmission parity PM for the data body DA and the ECC data ED stored in the data register 19B. The transmission parity PC stored in the data register 19B is transmitted to the transmission parity check circuit 19Ba. The transmission parity check circuit 19Ba checks whether the generated transmission parity PM and the transmission parity PC received from the data register 19B match with each other.

Next, the data body DA and the ECC data ED stored in the data register 19B excluding the transmission parity PC are transmitted to the sense amplifier 19C and temporarily stored therein. The data body DA and the ECC data ED stored in the sense amplifier 19C are written into the memory cell array 11.

Figure 14:
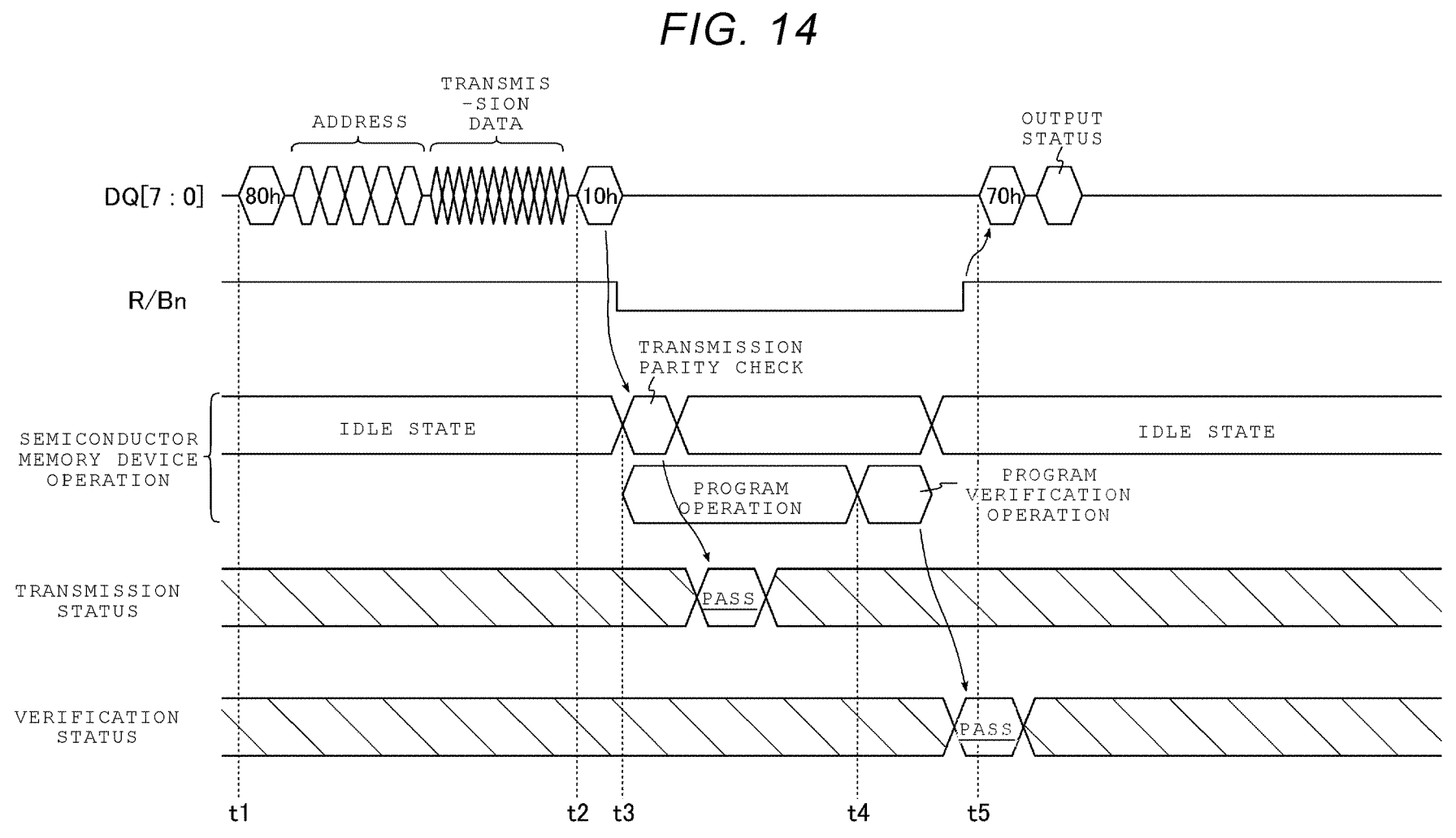
Figure 15:
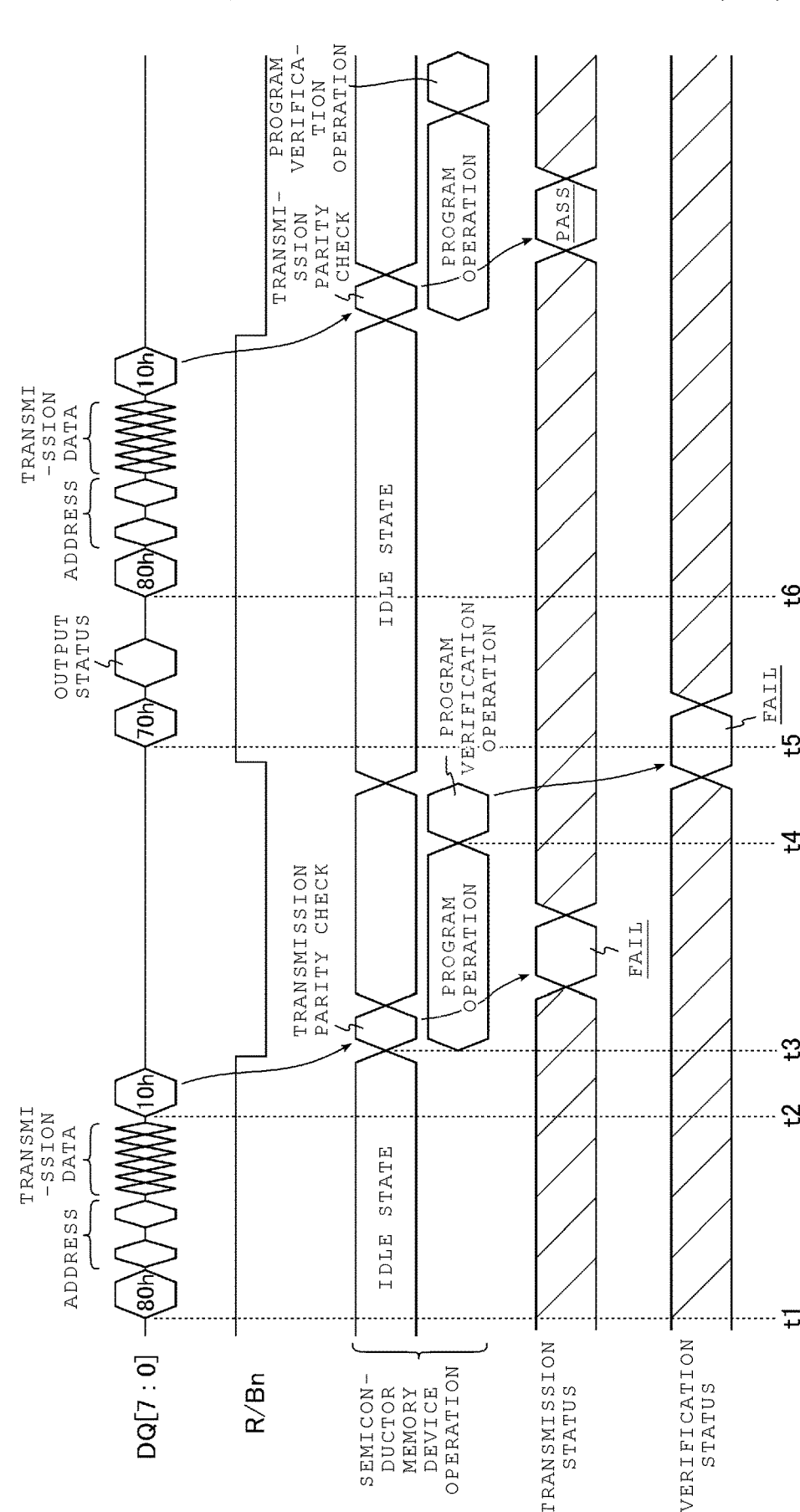
FIG. 15 is a timing chart illustrating the write operation in the memory system according to the first embodiment.

Hereinafter, the write operation in the memory system 1 of the first embodiment will be described. FIG. 13 is a flowchart illustrating the write operation in the memory system 1 of the first embodiment. FIGS. 14 and 15 are timing charts illustrating the write operation of the first embodiment. FIG. 14 illustrates a case where the transmission status is pass and the verification status is pass in the write operation. FIG. 15 illustrates a case where the transmission status is fail and the verification status is fail in the write operation. The operation in the memory controller 20 is controlled by the CPU 21. The write operation in the semiconductor memory device 10 is controlled by the sequencer 16.

As illustrated in FIG. 13, first, the memory controller 20 causes the second ECC circuit 24b in the ECC circuit 24 to generate the transmission parity PC for the data body DA and the ECC data ED in the transmission data (S1). The memory controller 20 adds the generated transmission parity PC to the data body DA and the ECC data ED. As a result, the transmission data is data including the data body DA, the ECC data ED, and the transmission parity PC. For example, the ECC data ED is generated by the first ECC circuit 24a in the ECC circuit 24 before Step S1.

Next, at time t1, the memory controller 20 transmits a data input command to the semiconductor memory device 10 (S2). For example, the data input command is a command "80h" (h represents that the number is a hexadecimal number). Next, a column address and a row address (for example, a block address and a page address) for designating a storage location into which the write data in the transmission data is to be written are transmitted to the semiconductor memory device 10. The memory controller 20 transmits the transmission data to the semiconductor memory device 10 (S3). As described above, the transmission data includes the data body DA, the ECC data ED, and the transmission parity PC.

When the data input command and the transmission data are received, the sequencer 16 of the semiconductor memory device 10 temporarily stores the transmission data in the cache register 12a. The write data in the transmission data is transmitted to the data register 19B (S4 and S5).

Next, the sequencer 16 causes the transmission parity check circuit 12b to generate the transmission parity PM for the data body DA and the ECC data ED in the write data included in the transmission data (S6).

Next, at time t2, the memory controller 20 transmits a write start command to the semiconductor memory device 10 (S7). For example, the write start command is a command "10h". Next, the memory controller 20 stands by until the ready/busy signal R/Bn representing that the semiconductor memory device 10 is in the ready state (that is, "H" level) is received (S8).

When the write start command is received (S9), at time t3, the sequencer 16 of the semiconductor memory device 10 starts the program operation of the write data stored in the data register 19B (S14). In the program operation, the write data in the data register 19B is written into the page in the block BLKn of the memory cell array 11 designated by the row address through the sense amplifier 19C.

According to an instruction from the sequencer 16, as illustrated in FIGS. 14 and 15, the transmission parity check circuit 12*b* checks whether the transmission parity PC received from the memory controller 20 and the transmission parity PM generated by the semiconductor memory device 10 match with each other in parallel with the program operation (S10). For example, during the program operation, various voltages to be applied to the memory cell array 11 are generated by a charge pump in the voltage generation circuit 17. The start-up and the like of the charge pump in the voltage generation circuit 17 during the program operation and the matching check between the transmission parity PC and the transmission parity PM are executed in parallel with each other. In the transmission parity PC and the transmission parity PM, the number of bits is relatively small. Therefore, the check can be executed within a short period of time. On the other hand, in the program operation, time is required for the start-up and the like of the charge pump in the voltage generation circuit 17 that generates various voltages to be applied to the memory cell array 11. Accordingly, the check of S10 can end before supplying the voltage to the wiring such as the word line in the memory cell array 11. The program operation and the check of the transmission parity are executed in parallel with each other. However, the program operation and the transmission parity check do not need to start at the same time, and the start times may be different from each other.

The sequencer 16 receives the result of the matching check in the transmission parity check circuit 12*b*. In Step S10, when the transmission parity PC and the transmission parity PM do not match with each other (No), the sequencer 16 sets the transmission status to fail as illustrated in FIG. 15. That is, information representing the transmission status is fail is stored in the status register 15A (S11). The semiconductor memory device 10 enters the ready state, and the ready/busy signal R/Bn representing that the semiconductor memory device 10 is in the ready state (that is, "H" level) is output to the memory controller 20 (S12).

On the other hand, when the transmission parity PC and the transmission parity PM match with each other, the sequencer 16 sets the transmission status to pass as illustrated in FIG. 14. It should be noted that information representing the transmission status is pass is stored in the status register 15A (S13).

After the check in Step S10, the transmission parity PC and the transmission parity PM are erased, for example, by reprogramming such as the next write operation.

At time t4, the sequencer 16 executes the program verification operation that is executed after the program operation (S15). The program operation and the program verification operation are repeatedly executed a predetermined number of times until the verification is passed in the program verification operation. When the verification is not passed even when the program operation and the program verification operation are executed a predetermined number of times, that is, when the verification fails a predetermined number of times (S16, Yes), the sequencer 16 sets the verification status to fail. That is, information representing the verification status to fail. That is, information representing the verification status is fail is stored in the status register 15A (S17). The semiconductor memory device 10 enters the ready state, and the ready/busy signal R/Bn representing that the semiconductor memory device 10 is in the ready state (that is, "H" level) is output to the memory controller 20 (S12). FIGS. 13, 14, and 15 illustrate a case where each of the program operation (S14) and the program verification operation (S15) is executed once to simplify the drawings.

On the other hand, when the verification in the program verification operation is passed (S16, No), the sequencer 16 sets the verification status to pass. That is, information representing the verification status is pass is stored in the status register 15A (S18). The semiconductor memory device 10 enters the ready state, and the ready/busy signal R/Bn representing that the semiconductor memory device 10 is in the ready state (that is, "H" level) is output to the memory controller 20 (S12).

The memory controller 20 enters a stand-by state after transmitting the write start command, and subsequently when the memory controller 20 grasps that the semiconductor memory device 10 is in the ready state based on the ready/busy signal R/Bn (S8), the memory controller 20 transmits a status read command to the semiconductor memory device 10 at time t5 (S19). For example, the status read command is a command "70h".

When the status read command is received (S20), the sequencer of the semiconductor memory device 10 transmits the transmission status and the verification status stored in the status register 15A to the memory controller 20 (S21).

When the transmission status and the verification status are received (S22), the memory controller 20 determines whether the transmission status is set to pass or fail (S23). When the transmission status is set to fail, the memory controller 20 returns to Step S2. Subsequently, the memory controller 20 and the semiconductor memory device 10 executes the processes after Step S2. That is, as illustrated in FIG. 15, at time t6, the memory controller 20 transmits the data input command "80h", the column address, the row address, the transmission data, and the write start command "10h" to the semiconductor memory device 10 again, and the memory controller 20 and the semiconductor memory device 10 executes the subsequent processes.

On the other hand, when the transmission status is set to pass, the memory controller 20 determines whether the verification status is set to pass or fail (S24). When the verification status is set to fail, the memory controller 20 changes the page in the block of the memory cell array 11 into which the write data is to be written (S25), in other words, changes the page address to be subsequently transmitted to the semiconductor memory device 10, and returns to Step S2. Subsequently, the memory controller 20 and the semiconductor memory device 10 executes the processes after Step S2. That is, the memory controller 20 transmits the data input command "80h", the column address, the row address including the changed page address, the transmission data, and the write start command "10h" to the semiconductor memory device 10 again, and the memory controller 20 and the semiconductor memory device 10 executes the subsequent processes.

On the other hand, in Step S24, when the verification status is set to pass, the memory controller 20 ends the write operation.

Figure 16:
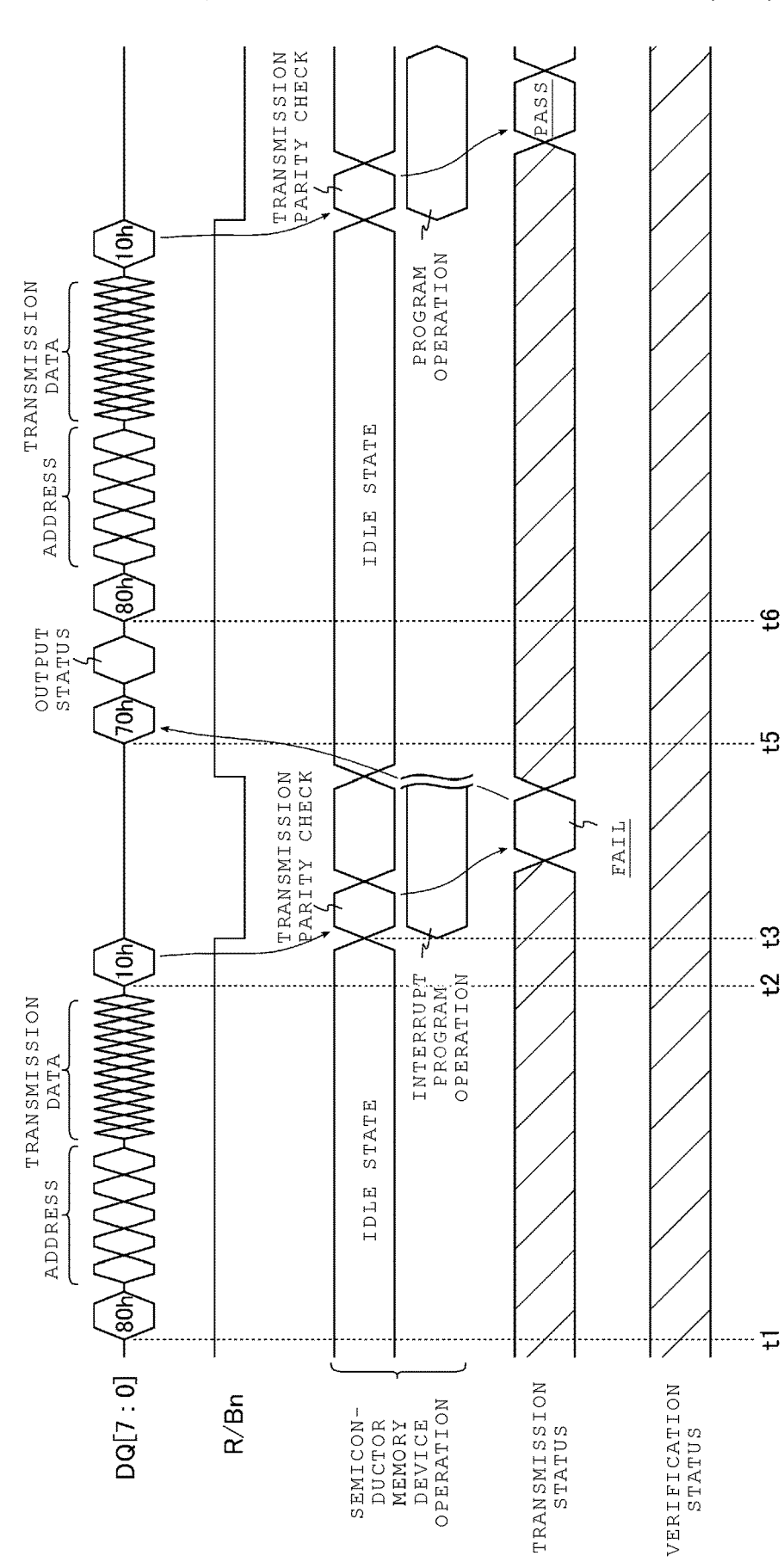
FIG. 16 is a timing chart illustrating the write operation in the memory system according to the first embodiment.

In the write operation, after the memory controller 20 transmits the write start command, the semiconductor memory device 10 executes the transmission parity check and the program operation in parallel with each other. Here, when the two transmission parities PC and PM do not match with each other in the transmission parity check, the sequencer 16 may interrupt the program operation or the program verification operation to stand by until the transmission data is transmitted again from the memory controller 20 to the semiconductor memory device 10. FIG. 16 is a timing chart when the transmission parities PC and PM do not match with each other and the sequencer 16 interrupts the program operation. Here, the sequencer 16 sets the transmission status to fail. When information representing that the transmission status is fail is received, at time t6, the memory controller 20 transmits the data input command, the column address, the row address, the transmission data, and the write start command to the semiconductor memory device 10. That is, the memory controller 20 transmits the transmission data to the semiconductor memory device 10 again.

In the write operation illustrated in FIG. 13, the semiconductor memory device 10 receives the write start command in Step S9 after generating the transmission parity PM in Step S6. However, the order may be reversed. That is, the semiconductor memory device 10 may generate the transmission parity PM after receiving the write start command.

In the write operation illustrated in FIG. 13, after receiving the transmission parity PC in Step S5, the semiconductor memory device 10 may receive the write start command (S9), start the program operation (S14), and then generate the transmission parity PM.

In the write operation illustrated in FIG. 13, after receiving the transmission parity PC in Step S5 and generating the transmission parity PM in Step S6, the semiconductor memory device 10 may check whether the transmission parity PC and the transmission parity PM match with each other (S10), set the transmission status to pass (S13), and then receive the write start command (S9).

1.3 Read Operation of Memory System

In the read operation of the first embodiment, when the transmission error occurred in the transmission data including the read data that is transmitted from the semiconductor memory device 10 to the memory controller 20, the transmission data is transmitted again from the cache register 12*a* in the semiconductor memory device 10 to the memory controller 20. As such, when the transmission error occurred, the transmission data only being transmitted again. Therefore, a period of time required for correcting the transmission error can be reduced. When the memory error occurred in the read data, a read method capable of high-accuracy error correction, for example, a soft bit read operation can be executed.

Next, the flow of data in the read operation of the first embodiment will be described using FIGS. 10, 11, and 12.

FIG. 10 illustrates a case where the transmission parity PM is generated by the transmission parity check circuit 12*b* in the input/output circuit 12 and transmitted to the NAND interface circuit 25 in the read operation of the first embodiment. The upward direction of the arrow in the drawing indicates the flow of data in the read operation.

The data body DA and the ECC data ED read from the memory cell array 11 are temporarily stored in the data register 19B through the sense amplifier 19C. Next, the data body DA and the ECC data ED stored in the data register 19B are transmitted to the cache register 12*a* in the input/output circuit 12 and temporarily stored therein.

The transmission parity check circuit 12*b* generates the transmission parity PM for the data body DA and the ECC data ED stored in the cache register 12*a*. The data body DA and the ECC data ED stored in the cache register 12*a* and the generated transmission parity PM are transmitted to the NAND interface circuit 25 in the memory controller 20 and temporarily stored therein. The data body DA, the ECC data ED, and the transmission parity PM stored in the NAND interface circuit 25 are transmitted to the RAM 22 and stored therein.

The second ECC circuit 24*b* generates the transmission parity PC for the data body DA and the ECC data ED stored in the RAM 22. The transmission parity PM stored in the RAM 22 is transmitted to the second ECC circuit 24*b*. Next, whether the generated transmission parity PC and the transmission parity PM stored in the RAM 22 match with each other is checked.

In the check, when the transmission parity PC and the transmission parity PM do not match with each other, the data body DA, the ECC data ED, and the transmission parity PM are transmitted again from the cache register 12*a* and the transmission parity check circuit 12*b*. On the other hand, when the transmission parity PC and the transmission parity PM match with each other, the second ECC circuit 24*b* executes the error checking on the data body DA stored in the RAM 22 using the ECC data ED.

FIG. 11 illustrates a case where the transmission parity PM is generated by the transmission parity check circuit 12*b* in the input/output circuit 12 and transmitted to the cache register 12*a* in the read operation of the first embodiment. The upward direction of the arrow in the drawing indicates the flow of data in the read operation.

The data body DA and the ECC data ED read from the memory cell array 11 are temporarily stored in the data register 19B through the sense amplifier 19C. Next, the data body DA and the ECC data ED stored in the data register 19B are transmitted to the cache register 12*a* in the input/output circuit 12 and temporarily stored therein.

The transmission parity check circuit 12*b* generates the transmission parity PM for the data body DA and the ECC data ED stored in the cache register 12*a*. The generated transmission parity PM is transmitted to the cache register 12*a* and temporarily stored therein.

The data body DA, the ECC data ED, and the transmission parity PM stored in the cache register 12*a* are transmitted to the NAND interface circuit 25 in the memory controller 20 and temporarily stored therein. The data body DA, the ECC data ED, and the transmission parity PM stored in the NAND interface circuit 25 are transmitted to the RAM 22 and stored therein.

The second ECC circuit 24*b* generates the transmission parity PC for the data body DA and the ECC data ED stored in the RAM 22. The transmission parity PM stored in the RAM 22 is transmitted to the second ECC circuit 24*b*. Next, the second ECC circuit 24*b* checks whether the generated transmission parity PC and the transmission parity PM stored in the RAM 22 match with each other.

In the check, when the transmission parity PC and the transmission parity PM do not match with each other, the data body DA, the ECC data ED, and the transmission parity PM are transmitted again from the cache register 12*a*. On the other hand, when the transmission parity PC and the transmission parity PM match with each other, the second ECC circuit 24*a* executes the error checking on the data body DA stored in the RAM 22 using the ECC data ED.

FIG. 12 illustrates a case where the transmission parity PM is generated by the transmission parity check circuit 19Ba provided in the vicinity of the data register 19B in the read operation of the first embodiment. The upward direction of the arrow in the drawing indicates the flow of data in the read operation.

The data body DA and the ECC data ED read from the memory cell array 11 are temporarily stored in the data register 19B through the sense amplifier 19C.

The transmission parity check circuit 19Ba generates the transmission parity PM for the data body DA and the ECC data ED stored in the data register 19B. The generated transmission parity PM is transmitted to the data register 19B and temporarily stored therein.

The data body DA, the ECC data ED, and the transmission parity PM stored in the data register 19B are transmitted to the cache register 12a in the input/output circuit 12 and temporarily stored therein.

The data body DA, the ECC data ED, and the transmission parity PM stored in the cache register 12a are transmitted to the NAND interface circuit 25 in the memory controller 20 and temporarily stored therein. The data body DA, the ECC data ED, and the transmission parity PM stored in the NAND interface circuit 25 are transmitted to the RAM 22 and stored therein.

The second ECC circuit 24b generates the transmission parity PC for the data body DA and the ECC data ED stored in the RAM 22. The transmission parity PM stored in the RAM 22 is transmitted to the second ECC circuit 24b. Next, whether the generated transmission parity PC and the transmission parity PM stored in the RAM 22 match with each other is checked.

In the check, when the transmission parity PC and the transmission parity PM do not match with each other, the data body DA, the ECC data ED, and the transmission parity PM are transmitted again from the cache register 12a. On the other hand, when the transmission parity PC and the transmission parity PM match with each other, the second ECC circuit 24a executes the error checking on the data body DA stored in the RAM 22 using the ECC data ED.

Figure 17:
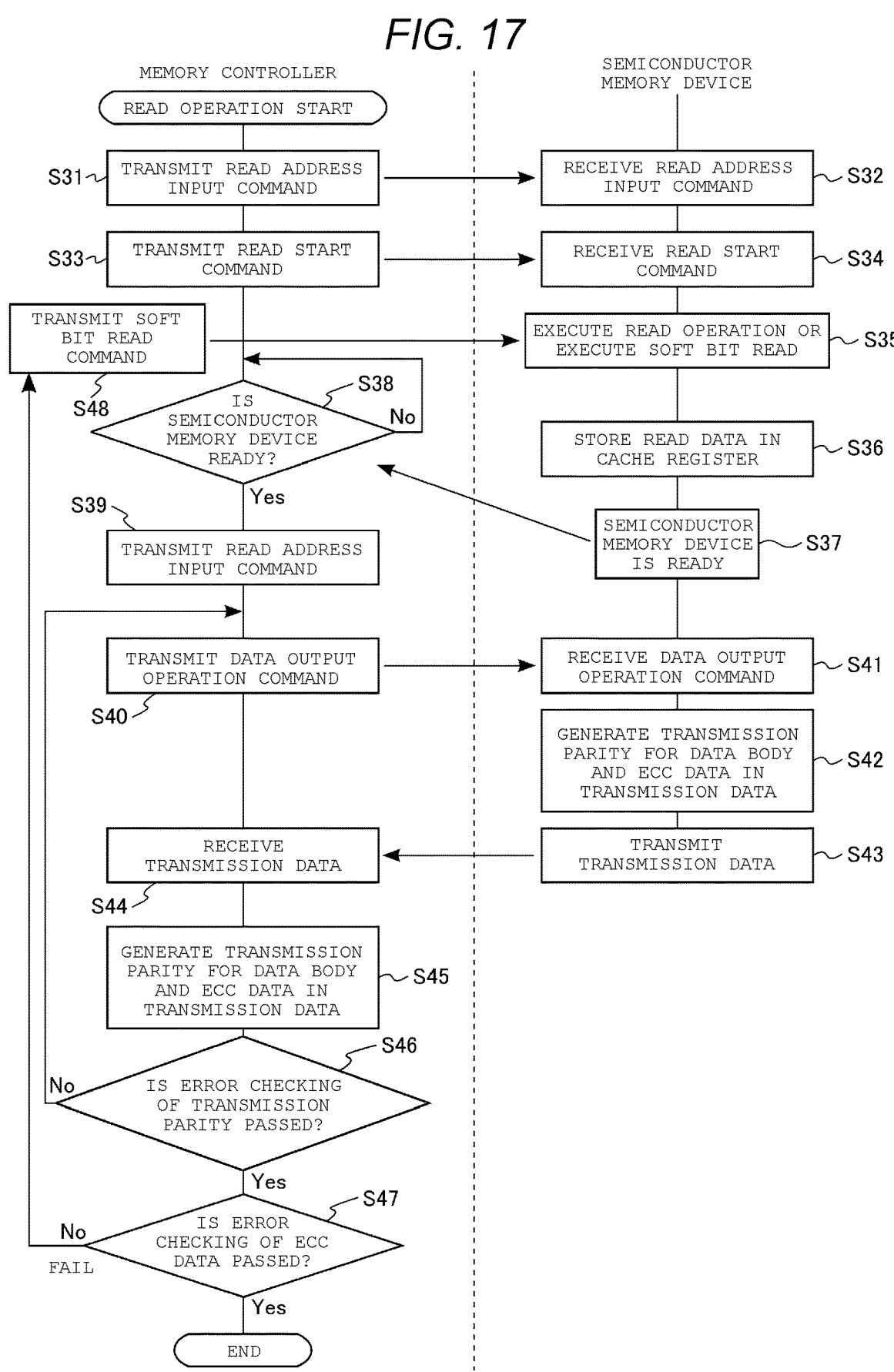
FIG. 17 is a flowchart illustrating a read operation in the memory system according to the first embodiment.
Figure 18:
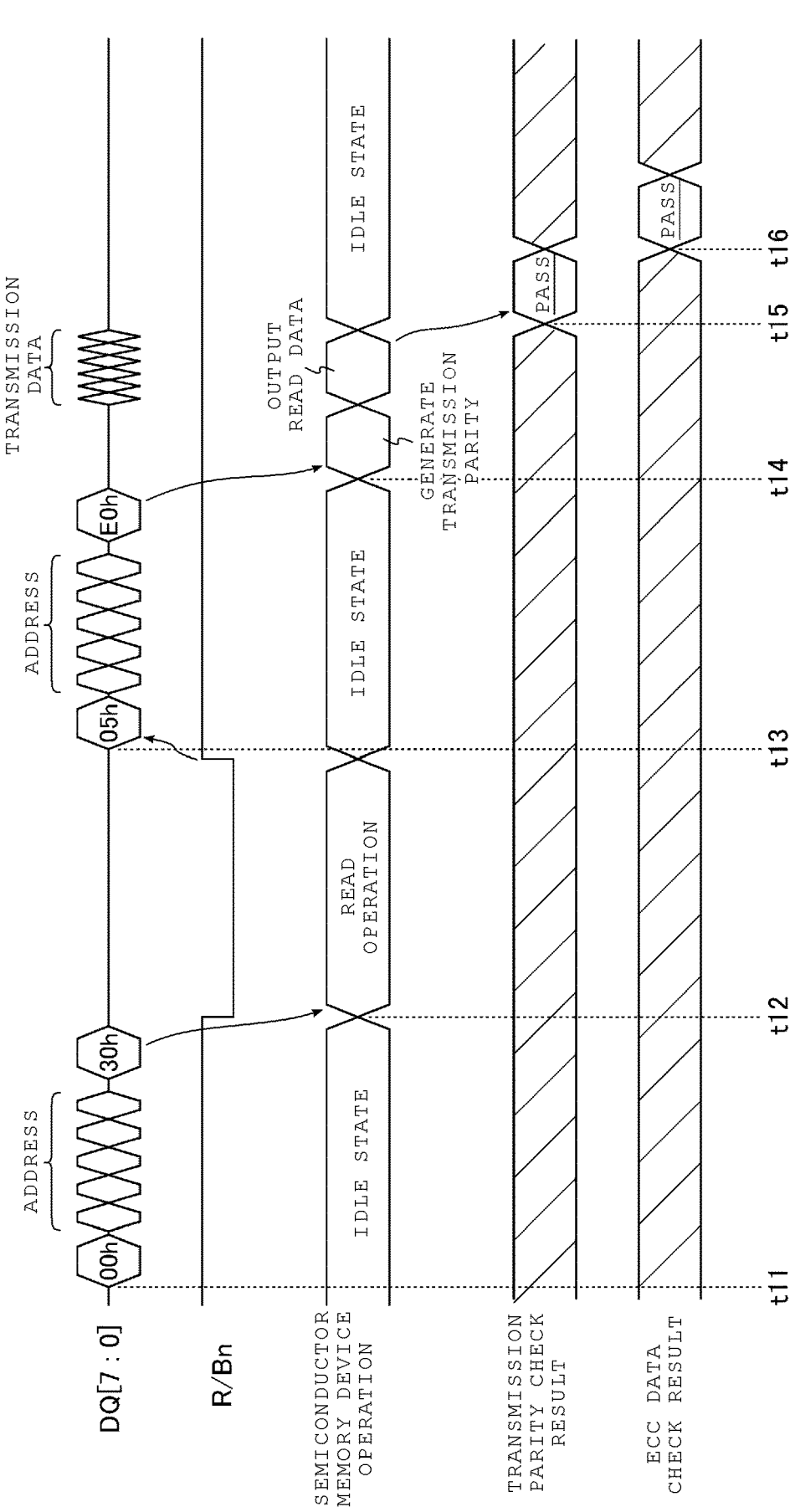
FIG. 18 is a timing chart illustrating the read operation in the memory system according to the first embodiment.
Figure 19:
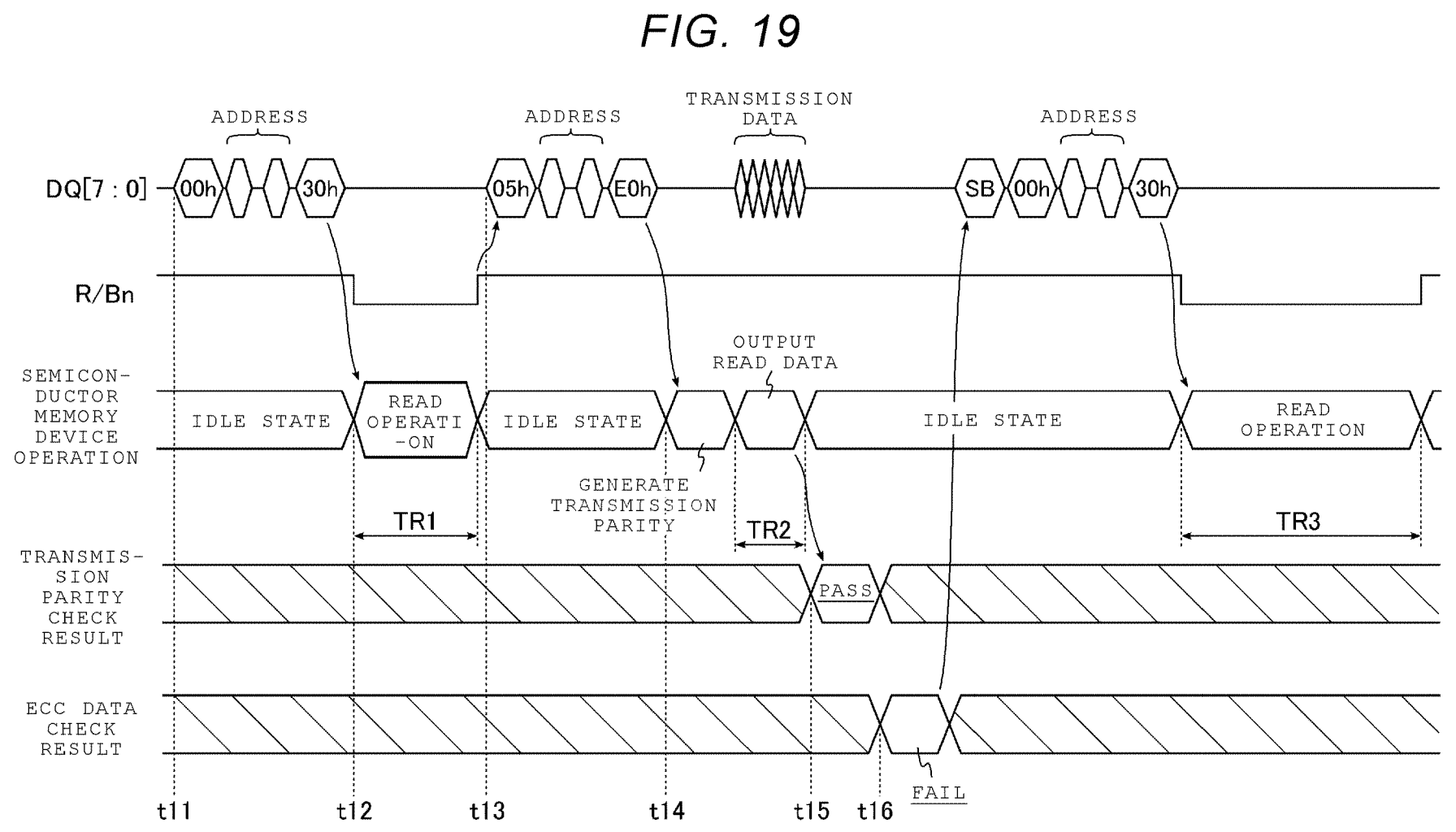
Figure 20:
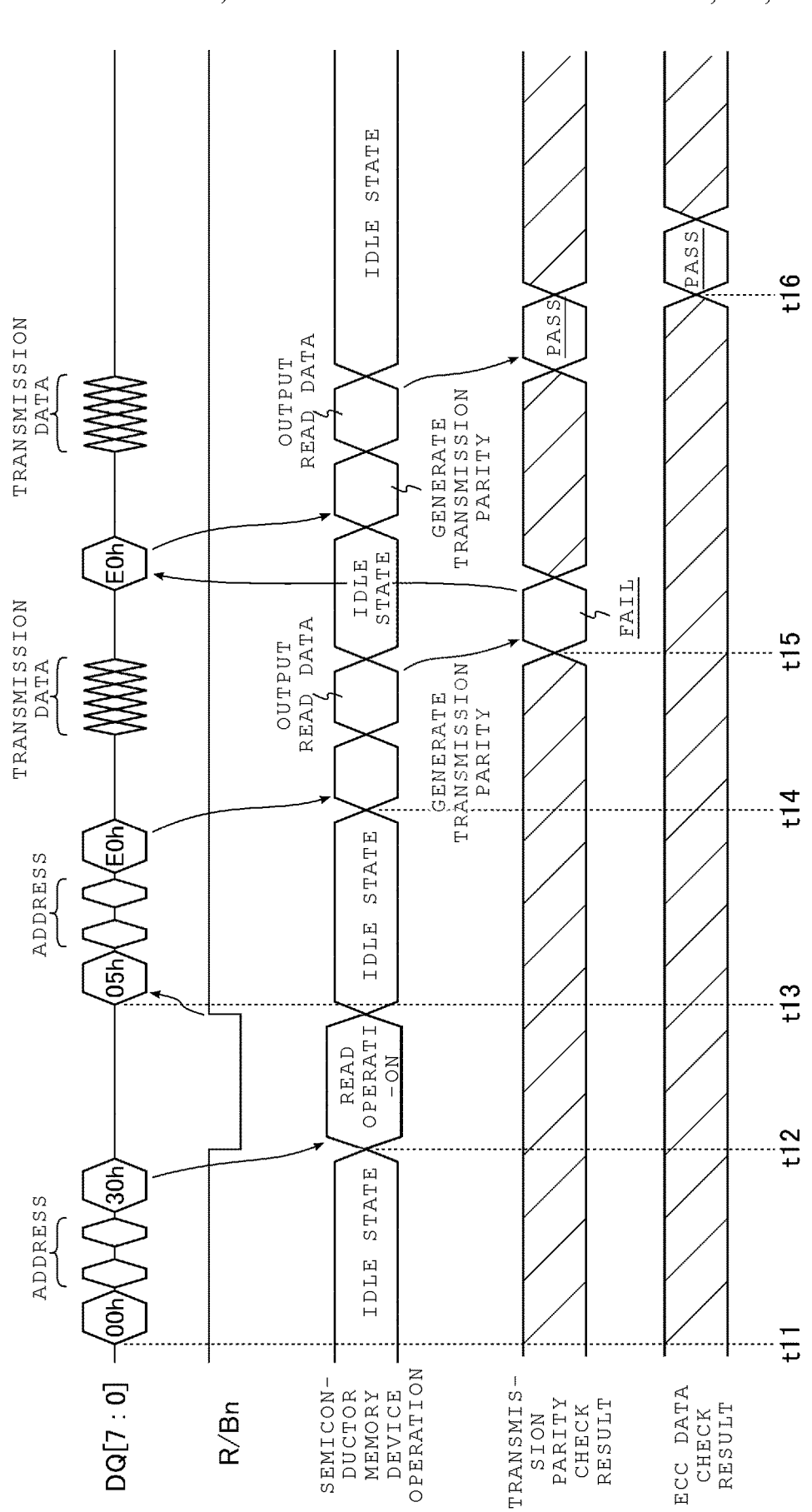
FIG. 20 is a timing chart illustrating the read operation in the memory system according to the first embodiment.

Hereinafter, the read operation in the memory system 1 of the first embodiment will be described. FIG. 17 is a flowchart illustrating the read operation in the memory system 1 according to the first embodiment. FIGS. 18, 19, and 20 illustrate timing charts illustrating the read operation of the first embodiment. FIG. 18 illustrates a case where the error checking of the transmission parity PM is passed and the error checking of the ECC data ED is passed in the read operation. FIG. 19 illustrates a case where the error checking of the transmission parity PM is passed and the error checking of the ECC data ED failed in the read operation. FIG. 20 illustrates a case where the error checking of the transmission parity PM failed, the error checking of the transmission parity PM is passed, and the error checking of the ECC data ED is passed in the read operation. The operation in the memory controller 20 is controlled by the CPU 21. The read operation in the semiconductor memory device 10 is controlled by the sequencer 16.

A command that is transmitted from the memory controller 20 to instruct the semiconductor memory device 10 to execute a normal read operation, that is, to store data in the data register 19B from the memory cell array 11 through the sense amplifier 19C will be referred to as a normal read command. A command that is transmitted from the memory controller 20 to instruct the semiconductor memory device 10 to output data from the data register 19B to the memory controller 20 through the cache register 12a will be referred to as a data output operation command. A command that is transmitted from the memory controller 20 to instruct the semiconductor memory device 10 to execute a soft bit read operation will be referred to as a soft bit read command.

First, the memory controller 20 transmits the normal read command to the semiconductor memory device 10. For example, the normal read command includes a read address input command "00h" and a read start command "30h". As illustrated in FIGS. 17 to 20, at time t11, the memory controller 20 transmits the read address input command "00h" to the semiconductor memory device 10 (S31). Next, a column address and a row address (for example, a block address and a page address) for designating a storage location as a read target are transmitted to the semiconductor memory device 10. The read start command "30h" is transmitted to the semiconductor memory device 10 (S33). The read address input command "00h" is a command for notifying the input of an address of a read target. The read start command "30h" is a command for instructing to read data from the storage location designated by the address of the read target.

When the command "00h", the column address, the row address, and the command "30h" are received (S32 and S34), at time t12, the sequencer 16 of the semiconductor memory device 10 reads data from the page in the block designated by the row address (S35). The read data read from the page in the block is temporarily stored in the cache register 12a through the sense amplifier 19C and the data register 19B (S36). When the read operation ends, the sequencer 16 sets the ready/busy signal R/Bn to the ready state (that is, "H" level) (S37).

When the memory controller 20 receives the ready/busy signal R/Bn representing that the semiconductor memory device 10 is in the ready state (S38), at time t13, the memory controller 20 transmits the read address input command "00h", the column address, the row address, and the data output operation command to the semiconductor memory device 10 (S39 and S40). For example, the data output operation command includes a command "E0h". Here, the read address input command "00h" and the address are transmitted again. However, when the retransmission is not necessary, the retransmission may be skipped.

When the data output operation command "E0h" is received (S41), at time t14, the sequencer 16 of the semiconductor memory device 10 generates the transmission parity PM for the data body DA and the ECC data ED in the read data stored in the cache register 12a (S42). The transmission parity PM is generated by the transmission parity check circuit 12b in the input/output circuit 12. The transmission parity check circuit 12b adds the generated transmission parity PM to the read data to generate transmission data.

Next, the sequencer 16 transmits the transmission data including the transmission parity PM to the memory controller 20 (S43).

When the transmission data is received (S44), at time t15, the second ECC circuit 24b in the memory controller 20 determines whether error occurred in the transmission parity PM provided in the transmission data, that is, whether the error checking of the transmission parity PM is passed (S45 and S46). Specifically, first, the second ECC circuit 24b generates the transmission parity PC for the data body DA and the ECC data ED in the transmission data stored in the RAM 22 (S45). The transmission parity PM stored in the RAM 22 is transmitted to the second ECC circuit 24b. Next, whether the generated transmission parity PC and the transmission parity PM in the transmission data stored in the RAM 22 match with each other is checked (S46). In the transmission parity PC and the transmission parity PM, the number of bits is relatively small. Therefore, the check can be executed in a short period of time. As illustrated in FIG. 20, when the error checking of the transmission parity PM is not passed (No), the memory controller 20 returns to Step S40 and transmits the data output operation command again to the semiconductor memory device 10.

When the data output operation command is received, the sequencer 16 of the semiconductor memory device 10 generates the transmission parity PM again for the data body DA and the ECC data ED in the transmission data stored in the cache register 12*a* (S42). Next, the processes after Step S43 are repeatedly executed. When the data output operation command is received again in Step S41, the sequencer 16 may skip Step S42 and proceed to Step S43 to transmit the transmission data to the memory controller 20. That is, in Step S42, the transmission parity PM is generated again. However, the transmission parity check circuit 12*b* may store the transmission parity PM, add the transmission parity PM to the data body DA and the ECC data ED to generate transmission data, and transmit the transmission data in Step S43.

On the other hand, in Step S45, as illustrated in FIG. 18, when the error checking of the transmission parity PM is passed (Yes), at time t16, the memory controller 20 determines whether error occurred in the data body DA in the transmission data using the ECC data ED, that is, whether the error checking using the ECC data ED is passed (S47).

As illustrated in FIG. 19, when the error checking using the ECC data ED is not passed, the memory controller 20 transmits the soft bit read command to the semiconductor memory device 10 (S48). When the soft bit read command is received, the semiconductor memory device 10 executes the soft bit read operation in Step S35, and then repeatedly executes the processes after Step S36. The soft bit read operation will be described below.

On the other hand, in Step S47, when the error checking using the ECC data ED is passed (Yes), the memory controller 20 ends the read operation.

After the check in Step S46, the transmission parity PC and the transmission parity PM are erased, for example, by reprogramming such as the next read operation.

In Steps S46 and S47, after the error checking using the transmission parity PM, the error checking using the ECC data ED is executed. However, the error checking operations may be executed in parallel with each other.

The normal read command may be a command for instructing to output data from the memory cell array 11 to the memory controller 20 through the sense amplifier 19C, the data register 19B and the cache register 12*a*. Here, the operations of Steps S37 to S41 in FIG. 17 and the operations at time t13 to time t14 in FIGS. 18 to 20 are skipped. That is, the transmission parity PM is generated immediately after the end of the read operation, and the data body DA, the ECC data ED, and the transmission parity PM are transmitted to the memory controller 20.

Figure 21:
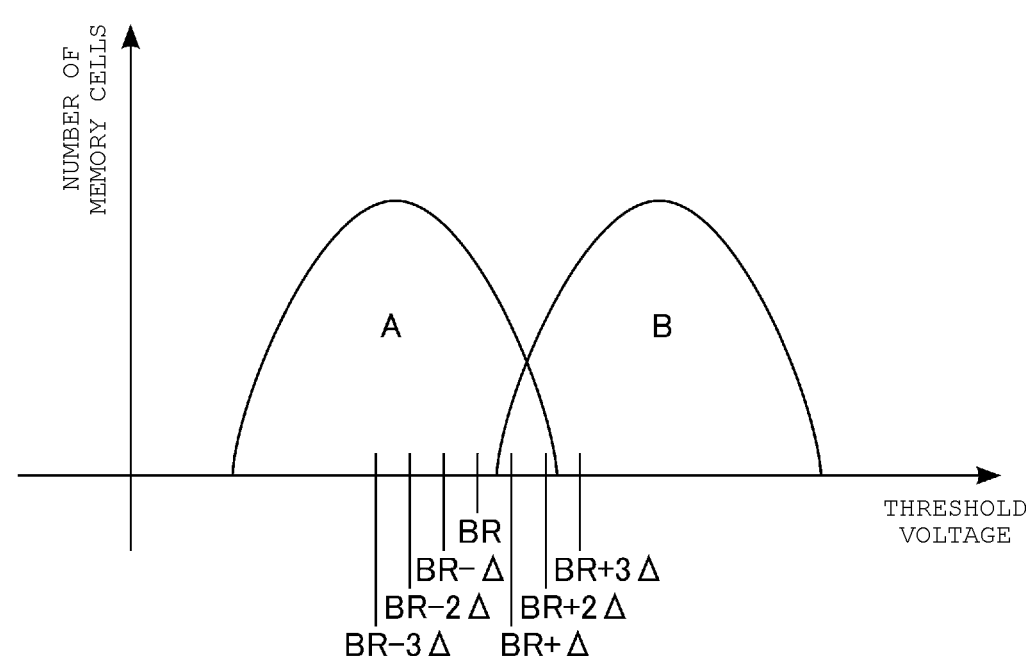
FIG. 21 is a diagram illustrating a soft bit read operation according to the first embodiment.

Hereinafter, the soft bit read operation that is executed in Step S35 will be described. FIG. 21 is a diagram illustrating the summary of the soft bit read operation. FIG. 21 illustrates threshold voltage distributions of the state "A" and the state "B" as an example of a distribution of threshold voltages of the plurality of memory cell transistors.

As illustrated in FIG. 21, the soft bit read operation includes a normal read operation and a plurality of shift read operations. The normal read operation is a basic read method, and a read voltage in the normal read operation is a reference for read voltages of the shift read operations. The shift read operation is a read method of shifting the read voltage of the normal read operation, and the shift amount is set with respect to a standard value of the read voltage in the normal read operation.

In the example of FIG. 21, the normal read operation corresponds to the read voltage BR as the standard value. The plurality of shift read operations correspond to read voltages shifted from the read voltage BR of the normal read operation by $\pm3\Delta$, $\pm2\Delta$, and $\pm\Delta$ (BR$\pm3\Delta$, BR$\pm2\Delta$, and BR$\pm\Delta$). That is, the read operations are executed at seven different read voltages (BR$-3\Delta$, BR$-2\Delta$, BR$-\Delta$, BR, BR$+\Delta$, BR$+2\Delta$, and BR$+3\Delta$) depending on the soft bit read operation to obtain seven pieces of read data. In the soft bit read operation, the plurality of read operations are continuously executed.

The ECC circuit 24 estimates a threshold voltage distribution of the plurality of memory cell transistors using the plurality of pieces of read data that are continuously read by the soft bit read operation. As a result, the ECC circuit 24 executes error correction with higher accuracy than error correction based on only one piece of read data.

As illustrated in FIG. 19, a period of time TR3 of a read operation that is executed by the semiconductor memory device 10 according to the soft bit read command is longer than a period of time TR2 of a read operation that is executed by the semiconductor memory device 10 according to the read start command. The period of time TR2 of a read operation that is executed by the semiconductor memory device 10 according to the read start command is longer than a period of time TR1 of a read operation that is executed by the semiconductor memory device 10 according to the data output operation command.

1.4 Effect of First Embodiment

The first embodiment can provide a semiconductor memory device and a memory system capable of reducing a period of time of a write operation and a read operation.

In the configuration of the first embodiment, whether error occurring in data during the write operation and the read operation is error occurring when data is transmitted between the memory controller 20 and the semiconductor memory device 10 (that is, transmission error) or error occurring when data is written into and read from the memory cell array 11 (that is, memory error) can be determined.

In general, the occurrence probability of the memory error is relatively high, and ECC such as LDPC having a high error correction capability and a high calculation amount is used for correcting the memory error. In the related art, since the transmission error and the memory error are not distinguished from each other, it can be assumed that the transmission error is also corrected using ECC having a high correction capability and a large calculation amount. However, in general, the occurrence probability of the transmission error is lower than that of the memory error, and the transmission error can be detected using ECC such as parity having a low correction capability and a small calculation amount. Therefore, in the configuration of the first embodiment, the transmission error can be detected in a short period of time by using the transmission parity for data that is transmitted and received during the write operation or the read operation.

In the configuration of the first embodiment, when the transmission data including the write data is transmitted from the memory controller 20 to the semiconductor memory device 10 in the write operation and the transmission error occurred in the transmission data, by transmitting the transmission data from the memory controller 20 to the semiconductor memory device 10 again, the transmission error including the write data can be corrected in a short period of time.

In general, the transmission error is a random event that occurs at a higher frequency as the number of semiconductor memory devices 10 connected to the memory controller 20 increases and the frequency of a signal increases. The transmission error is a random event, and the probability that the transmission error occurs two times continuously is relatively low. Therefore, when the write data is transmitted again, the transmission error does not occur in the re-transmitted write data with a high probability.

In the configuration of the first embodiment, by executing the transmission error check in the write operation and the program operation of the write data into the memory cell array 11 in parallel with each other, the effect on the write operation time can be minimized, that is, an increase in time required for the write operation can be prevented.

In the configuration of the first embodiment, when the transmission data including the read data is transmitted from the semiconductor memory device 10 to the memory controller 20 in the read operation and the transmission error occurred in the transmission data, by transmitting the transmission data from the semiconductor memory device 10 to the memory controller 20 again, the transmission error including the read data can be corrected in a short period of time. Due to the same reason as that of the write operation, when the read data is transmitted again, the transmission error does not occur in the re-transmitted read data with a high probability. As a result, time required for the read operation can be reduced.

In the configuration of the first embodiment, an appropriate operation can be selected and executed depending on whether error occurring in the read data during the read operation is the transmission error or the memory error.

In general, when error occurred in the read data during the read operation, the execution of the read operation such as the soft bit read operation is considered. However, the soft bit read operation enables high-accuracy error correction but has a problem in that the correction rate is slow. In the configuration of the first embodiment, whether error occurring in the read data is the transmission error or the memory error can be determined. When the error is the transmission error, the read data is transmitted again from the semiconductor memory device 10 to the memory controller 20. As a result, the transmission error occurring in the read data can be corrected without using the soft bit read operation having a slow correction rate. On the other hand, when the error occurring in the read data is the memory error, the soft bit read operation capable of high-accuracy error correction is executed in the semiconductor memory device 10. As a result, error occurring in the read data can be corrected using an appropriate error correction method, and a period of time required for the read operation can be reduced.

As the read operation for correcting the memory error, for example, the soft bit read operation is used as described above. However, the embodiment is not limited thereto. For example, instead of the soft bit read operation, a read operation of searching for an optimum read voltage for the program operation by reading data multiple times (hereinafter, referred to a Vth tracking read operation) may be used. The Vth tracking read operation is a read operation of searching for a threshold voltage distribution of the memory cell transistors in the page and executing the program operation using a read voltage that is corrected based on the obtained threshold voltage distribution.

2. Second Embodiment

A memory system according to a second embodiment will be described. In the first embodiment, whether the transmission error occurred in the transmission data including the write data that is transmitted from the memory controller 20 is checked, and the write data is written into the memory cell array 11 in parallel with the transmission error check. However, in the second embodiment, the write data is written into the memory cell array 11 of the semiconductor memory device 10 after the transmission error check is passed. In the second embodiment, different points from the first embodiment will be described.

2.1 Configuration of Memory System

Circuit configurations of the memory controller 20 and the semiconductor memory device 10 according to the second embodiment are the same as those of the first embodiment.

2.2 Write Operation of Memory System

Figure 23:
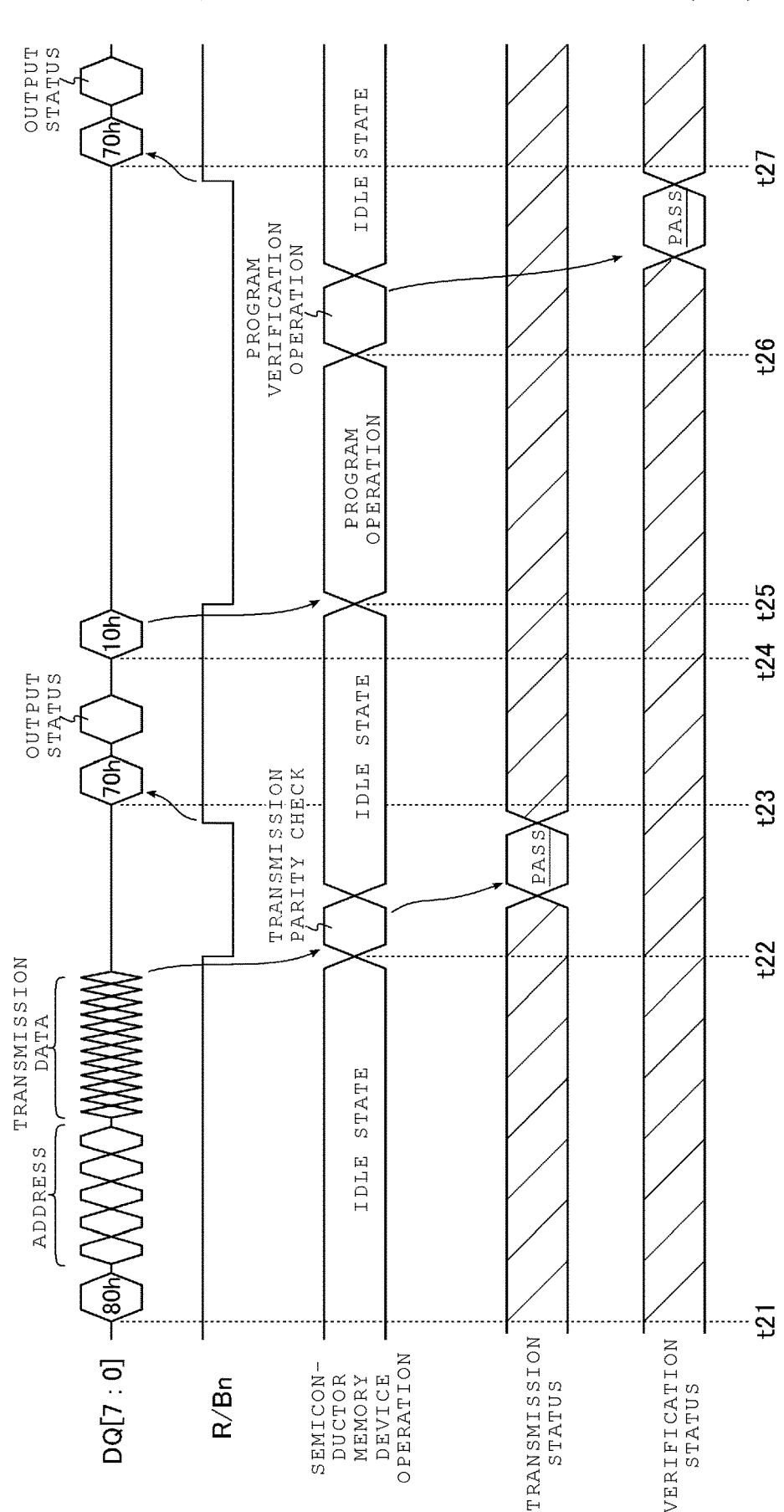
FIG. 23 is a timing chart illustrating the write operation in the memory system according to the second embodiment.
Figure 24:
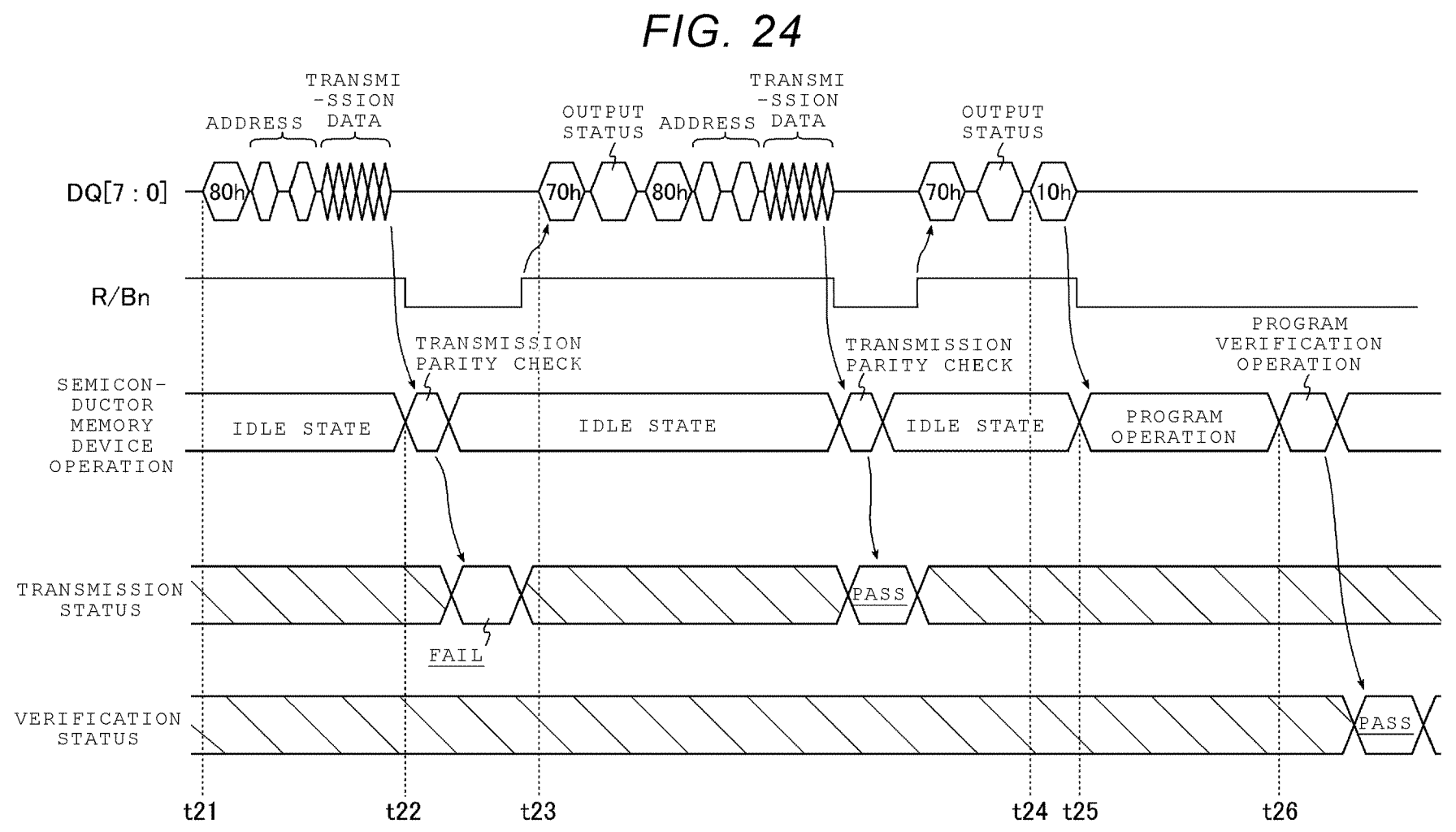

Hereinafter, the write operation in the memory system 1 of the second embodiment will be described. FIG. 22 is a flowchart illustrating the write operation in the memory system 1 of the second embodiment. FIGS. 23 and 24 are timing charts illustrating the write operation of the second embodiment. FIG. 23 illustrates a case where the transmission status is pass and the verification status is pass in the write operation. FIG. 24 illustrates a case where the transmission status is fail, the subsequent transmission status is pass, and the verification status is pass in the write operation. The operation in the memory controller 20 is controlled by the CPU 21. The write operation in the semiconductor memory device 10 is controlled by the sequencer 16.

As illustrated in FIG. 22, first, the memory controller 20 causes the second ECC circuit 24b in the ECC circuit 24 to generate the transmission parity PC for the data body DA and the ECC data ED in the transmission data (S51). The memory controller 20 adds the generated transmission parity PC to the data body DA and the ECC data ED. As a result, the transmission data is data including the data body DA, the ECC data ED, and the transmission parity PC.

Next, at time t21, the memory controller 20 transmits a data input command to the semiconductor memory device 10 (S52). For example, the data input command is a command "80h". Next, a column address and a row address for designating a storage location into which the write data in the transmission data is to be written are transmitted to the semiconductor memory device 10. The memory controller 20 transmits the transmission data to the semiconductor memory device 10 (S53). The transmission data includes the data body DA, the ECC data ED, and the transmission parity PC. Next, the memory controller 20 ends the check on the transmission parity PC in the semiconductor memory device 10, and stands by until the memory controller 20 grasps that the semiconductor memory device 10 is in the ready state based on the ready/busy signal R/Bn (S54).

When the data input command and the transmission data are received, the sequencer 16 of the semiconductor memory device 10 temporarily stores the transmission data in the cache register 12a. The write data in the transmission data is transmitted to the data register 19B (S55 and S56).

Next, the sequencer 16 causes the transmission parity check circuit 12b to generate the transmission parity PM for the data body DA and the ECC data ED in the write data provided in the transmission data (S57).

Next, at time t22, according to an instruction from the sequencer 16, the transmission parity check circuit 12b checks whether the transmission parity PC received from the memory controller 20 and the transmission parity PM generated by the semiconductor memory device 10 match with each other (S58). When the transmission parity PC and the transmission parity PM do not match with each other (No), the sequencer 16 sets the transmission status to fail as illustrated in FIG. 24. That is, information representing the transmission status is fail is stored in the status register 15A

(S59). On the other hand, when the transmission parity PC and the transmission parity PM match with each other (Yes), the sequencer 16 sets the transmission status to pass as illustrated in FIG. 23. That is, information representing the transmission status is pass is stored in the status register 15A (S60). Next, the semiconductor memory device 10 enters the ready state, and the ready/busy signal R/Bn representing that the semiconductor memory device 10 is in the ready state (that is, "H" level) is output to the memory controller 20 (S61).

The memory controller 20 enters a stand-by state after transmitting the transmission data, and subsequently, when the memory controller 20 grasps that the semiconductor memory device 10 is in the ready state based on the ready/busy signal R/Bn (S54), the memory controller 20 transmits a status read command to the semiconductor memory device 10 at time t23 (S62). For example, the status read command is a command "70h".

When the status read command is received (S63), the sequencer 16 of the semiconductor memory device 10 transmits the transmission status stored in the status register 15A to the memory controller 20 (S64).

When the transmission status is received (S65), the memory controller 20 determines whether the transmission status is set to pass or fail (S66). When the transmission status is set to fail, the memory controller 20 returns to Step S52. Then, the memory controller 20 and the semiconductor memory device 10 executes the processes after Step S52. That is, as illustrated in FIG. 24, the memory controller 20 transmits the data input command "80h", the column address, the row address, and the transmission data to the semiconductor memory device 10 again, and the memory controller 20 and the semiconductor memory device 10 executes the subsequent processes.

On the other hand, when the transmission status is set to pass, at time t24, the memory controller 20 transmits a write start command to the semiconductor memory device 10 (S67). For example, the write start command is a command "10h". Next, the memory controller 20 stands by until the program operation and the program verification operation end in the semiconductor memory device 10 (S68). That is, the memory controller 20 stands by until the program operation and the program verification operation end, and the ready/busy signal R/Bn representing that the semiconductor memory device 10 is in the ready state (that is, "H" level) is received.

When the write start command is received (S69), at time t25, the sequencer 16 of the semiconductor memory device 10 starts the program operation of the write data stored in the data register 19B (S70). In the program operation, the write data in the data register 19B is written into the page in the block BLKn of the memory cell array 11 designated by the row address.

Next, at time t26, the sequencer 16 executes the program verification operation that is executed after the program operation (S71). The program operation and the program verification operation are repeatedly executed a predetermined number of times until the verification is passed in the program verification operation. When the verification is not passed even when the program operation and the program verification operation are executed a predetermined number of times, that is, when the verification fails a predetermined number of times (S72, Yes), the sequencer 16 sets the verification status to fail. That is, information representing the verification status is fail is stored in the status register 15A (S73). On the other hand, when the verification in the program verification operation is passed (No), the sequencer 16 sets the verification status to pass. That is, information representing the verification status is pass is stored in the status register 15A (S74). The semiconductor memory device 10 enters the ready state, and the ready/busy signal R/Bn representing that the semiconductor memory device 10 is in the ready state (that is, "H" level) is output to the memory controller 20 (S75).

The memory controller 20 enters a stand-by state after transmitting the write start command, and subsequently when the memory controller 20 grasps that the semiconductor memory device 10 is in the ready state based on the ready/busy signal R/Bn (S68), the memory controller 20 transmits a status read command to the semiconductor memory device 10 at time t27 (S76). For example, the status read command is a command "70h".

When the status read command is received (S77), the sequencer 16 of the semiconductor memory device 10 transmits the verification status stored in the status register 15A to the memory controller 20 (S78).

When the verification status is received (S79), the memory controller 20 determines whether the verification status is set to pass or fail (S80). When the verification status is set to fail, the memory controller 20 changes the page in the block of the memory cell array 11 into which the write data is to be written (S81), in other words, changes the page address to be subsequently transmitted to the semiconductor memory device 10, and returns to Step S52. Then, the memory controller 20 and the semiconductor memory device 10 executes the processes after Step S52. That is, the memory controller 20 transmits the data input command "80h", the column address, the row address including the changed page address, and the transmission data to the semiconductor memory device 10 again, and the memory controller 20 and the semiconductor memory device 10 executes the subsequent processes.

On the other hand, in Step S80, when the verification status is set to pass, the memory controller 20 ends the write operation.

2.3 Effect of Second Embodiment

The second embodiment can provide a semiconductor memory device and a memory system capable of reducing a period of time of a write operation.

In the configuration of the second embodiment, when the transmission data including the write data is transmitted from the memory controller 20 to the semiconductor memory device 10 in the write operation and the transmission error occurred in the transmission data, by transmitting the transmission data from the memory controller 20 to the semiconductor memory device 10 again, the transmission error including the write data can be corrected in a short period of time.

In the configuration of the second embodiment, when the transmission error check is passed in the write operation, by executing the program operation of the write data into the memory cell array 11, the write data including the transmission error can be reliably prevented from being written into the memory cell array 11. As a result, an increase in the number of written memory cells can be prevented.

3. Others

In at least embodiment, the NAND flash memory is described as the example of the semiconductor memory device. However, the embodiments not limited to the NAND flash memory and are applicable to other semiconductor memory devices and various storage devices other than the semiconductor memory devices. In the flowcharts described in the embodiments, the order of the process can be changed as much as possible.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

For example, the first embodiment and the second embodiment may be switched by set features and the like. Here, the first embodiment and the second embodiment may be switched depending on the ratio of written memory cells. For example, when the ratio of written memory cells is low, the mode of the first embodiment is adopted, and when the ratio of written memory cells is high, the mode of the second embodiment is adopted.

What is claimed is:

1. A semiconductor memory device comprising:
a memory cell array configured to store data; and
a control circuit configured to control a write operation to write data into the memory cell array, wherein
for control of the write operation, the control circuit is configured to:
receive first data and a first parity bit,
generate a second parity bit for the first data,
check whether the first parity bit and the second parity bit match each other, and
write second data into the memory cell array,
wherein
the first data includes the second data, and data for error detection generated for the second data.

2. The semiconductor memory device according to claim 1, wherein
for control of the write operation, the control circuit is configured to:
write the first data into the memory cell array, while writing the first parity bit into the memory cell array being omitted.

3. The semiconductor memory device according to claim 1, wherein
the control circuit is configured to check whether the first parity bit and the second parity bit match each other in parallel with a start-up of a voltage generation circuit for the write operation of writing the second data into the memory cell array.

4. The semiconductor memory device according to claim 1, wherein
when the first parity bit and the second parity bit do not match each other in the check operation,
the control circuit sets information representing that the first parity bit and the second parity bit do not match each other.

5. The semiconductor memory device according to claim 1, wherein
when the first parity bit and the second parity bit do not match each other in the check operation,
the control circuit receives the first data and the first parity bit again.

6. The semiconductor memory device according to claim 1, further comprising a parity check circuit configured to generate the second parity bit and check whether the first parity bit and the second parity bit match each other.

7. The semiconductor memory device according to claim 1, wherein
when the first parity bit and the second parity bit match each other in the check operation,
the control circuit executes the write operation of writing the second data into the memory cell array.

8. The semiconductor memory device according to claim 1, wherein
after ending the check on whether the first parity bit and the second parity bit match each other, the control circuit is configured to erase the first parity bit and the second parity bit.

9. The semiconductor memory device according to claim 1, wherein
calculation amount for generation of the data for error detection is higher than calculation amount for generation of the second parity bit.

10. The semiconductor memory device according to claim 1, wherein
error correction capability of the data for error detection is higher than error correction capability of the first parity bit.

11. The semiconductor memory device according to claim 1, wherein
the number of bits in the data for error detection is more than the number of bits in the first parity.

12. The semiconductor memory device according to claim 1, wherein
the semiconductor memory device is a NAND flash memory.

13. The semiconductor memory device according to claim 1, wherein
the memory cell array includes a memory cell capable to store one-bit data.

14. The semiconductor memory device according to claim 1, wherein
the memory cell array includes a memory cell capable to store three-bit data.

15. The semiconductor memory device according to claim 1, further comprising:
a first register to store the second data in an input/output circuit.

16. The semiconductor memory device according to claim 15, further comprising:
a second register to store the second data electrically provided between the first register and the memory cell array.

17. The semiconductor memory device according to claim 16, further comprising:
a sense amplifier to store the second data electrically provided between the second register and the memory cell array.

18. The semiconductor memory device according to claim 1, further comprising:
a storage circuit;
an ENOR gate; and
an AND gate.

19. The semiconductor memory device according to claim 18, further comprising:
the storage circuit stores one of bits of the first parity or the second parity, the one of bits of the first parity or the second parity are input to the ENOR gate, output of the ENOR gate is input to the AND gate.

20. The semiconductor memory device according to claim 1, further comprising:
a plurality of ENOR gates; and
an AND gate.

21. The semiconductor memory device according to claim 20, further comprising:

each of bits of the first parity and the second parity are input to each of the plurality of the ENOR gates respectively, output of the plurality of the ENOR gates are input to the AND gate.

22. The semiconductor memory device according to claim 1, wherein each of bits of the first parity is sequentially input to a check circuit.

23. The semiconductor memory device according to claim 21, wherein the first parity bit is a transmission parity for the first data.

24. The semiconductor memory device according to claim 1, wherein the memory cell array includes a plurality of memory pillars located in a staggered arrangement.

25. The semiconductor memory device according to claim 1, wherein the memory cell array includes a plurality of memory pillars including a first insulating layer, a second insulating layer and a third insulating layer, the second insulating layer is disposed on a side surface of the first insulating layer, and the third insulating layer is disposed on a side surface of the second insulating layer.

26. The semiconductor memory device according to claim 1, wherein the memory cell array includes a bit line overlapping a memory pillar when viewed from a first direction intersecting to a substrate, the bit line is electrically connected to the memory pillar through a contact.

27. A memory system comprising:

a semiconductor memory device including:

a memory cell array configured to store data, and a control circuit configured to control a write operation to write data into the memory cell array; and a controller configured to control the semiconductor memory device, wherein for control of the write operation, the controller is configured to:

generate a first parity bit for the first data, and transmit the first data, the first parity bit, and a command to instruct the write operation to the semiconductor memory device, and the control circuit is configured to:

generate a second parity bit for the first data, check the first parity bit and the second parity bit match each other, and write second data into the memory cell array, wherein the first data includes the second data, and data for error detection generated for the second data.

28. The memory system according to claim 27, wherein the control circuit is configured to:

check whether the first parity bit and the second parity bit match each other in parallel with a start-up of a voltage generation circuit for the write operation of writing the second data into the memory cell array.

29. The memory system according to claim 27, wherein when the first parity bit and the second parity bit do not match each other in the check, the control circuit sets first information representing that the first parity bit and the second parity bit do not match each other, and when receiving the first information, the controller is configured to transmit the first data and the first parity bit to the semiconductor memory device.

30. The memory system according to claim 27, further comprising:

a plurality of semiconductor memory devices including the semiconductor memory device.

31. The memory system according to claim 27, wherein the number of the semiconductor memory devices are four or more.

32. A memory system comprising:

a semiconductor memory device including:

a memory cell array configured to store data, and a control circuit configured to control a read operation of reading data from the memory cell array; and a controller configured to control the semiconductor memory device, wherein for the control of the read operation, the controller is configured to transmit a first command to the semiconductor memory device, the control circuit is configured to:

execute a first read operation to read first data from the memory cell array according to the first command, generate a first parity bit for the first data, and execute a second read operation to transmit the first data and the first parity bit to the controller, and the controller is configured to:

generate a second parity bit for the first data, and check whether the first parity bit and the second parity bit match each other.

33. The memory system according to claim 32, wherein the first data includes second data, and data for error detection generated for the second data.

34. The memory system according to claim 32, wherein when the first parity bit and the second parity bit do not match each other, the controller is configured to transmit a second command to the semiconductor memory device, and the control circuit is configured to transmit the first data and the first parity bit to the controller according to the second command.

35. The memory system according to claim 34, wherein the first read operation takes longer the second read operation.

36. The memory system according to claim 32, wherein when the first parity bit and the second parity bit match each other, the controller is configured to execute error checking on the second data using the data for error detection, and when the error checking fails, transmit a third command to the semiconductor memory device, and the control circuit is configured to execute a third read operation different from the first read operation and the second read operation according to the third command, and when the error checking is passed, the controller is configured to end the read operation.

37. The memory system according to claim 36, wherein the first read operation takes longer than the second read operation, and the third read operation takes longer than the first read operation.

38. The memory system according to claim 34, wherein the semiconductor memory device further includes a register configured to store the first data, in the first read operation, the first data read from the memory cell array is stored in the register, and

in the second read operation, the first data stored in the register is transmitted to the controller.

39. The memory system according to claim 36, wherein in the third read operation, the first data is read from the memory cell array based on a plurality of pieces of read data obtained by a read operation using a plurality of read voltages, the plurality of read voltages includes a standard value and other values.

* * * * *